(12) United States Patent
Yamashita et al.

(10) Patent No.: US 7,952,542 B2
(45) Date of Patent: May 31, 2011

(54) IMAGE DISPLAY DEVICE AND ELECTRONIC APPLIANCE

(75) Inventors: Junichi Yamashita, Tokyo (JP); Yutaka Mitomi, Kanagawa (JP); Tetsuo Minami, Tokyo (JP); Takao Tanikame, Kanagawa (JP)

(73) Assignee: Sony Corporation, Tokyo (JP)

( * ) Notice: Subject to any disclaimer, the term of this patent is extended or adjusted under 35 U.S.C. 154(b) by 964 days.

(21) Appl. No.: 11/889,144

(22) Filed: Aug. 9, 2007

(65) Prior Publication Data

US 2008/0042939 A1 Feb. 21, 2008

(30) Foreign Application Priority Data

Aug. 18, 2006 (JP) ................................. 2006-222846

(51) Int. Cl.
G09G 3/30 (2006.01)
(52) U.S. Cl. ........................ 345/76; 315/169.3
(58) Field of Classification Search .............. 345/76–83; 315/169.3
See application file for complete search history.

(56) References Cited

U.S. PATENT DOCUMENTS

| | | | |
|---|---|---|---|
| 7,173,590 B2 * | 2/2007 | Uchino et al. ................... | 345/92 |
| 2003/0095087 A1 * | 5/2003 | Libsch et al. .................... | 345/82 |
| 2004/0150593 A1 * | 8/2004 | Yen et al. ......................... | 345/82 |
| 2005/0057456 A1 * | 3/2005 | Hu et al. .......................... | 345/76 |
| 2005/0116907 A1 * | 6/2005 | Miyazawa ....................... | 345/76 |
| 2005/0168415 A1 * | 8/2005 | Noda et al. ...................... | 345/76 |
| 2005/0269959 A1 * | 12/2005 | Uchino et al. .............. | 315/169.3 |
| 2006/0028407 A1 * | 2/2006 | Chou ............................... | 345/76 |
| 2006/0066527 A1 * | 3/2006 | Chou ............................... | 345/76 |
| 2006/0066532 A1 * | 3/2006 | Jeong ............................... | 345/76 |
| 2006/0077134 A1 * | 4/2006 | Hector et al. ................... | 345/76 |
| 2006/0170628 A1 * | 8/2006 | Yamashita et al. .............. | 345/76 |

FOREIGN PATENT DOCUMENTS

| | | |
|---|---|---|
| JP | 2003-255856 | 9/2003 |
| JP | 2003-271095 | 9/2003 |
| JP | 2003-308030 | 10/2003 |
| JP | 2003-323154 | 11/2003 |
| JP | 2004-029791 | 1/2004 |
| JP | 2004-093682 | 3/2004 |
| JP | 2004-133240 | 4/2004 |
| JP | 2005-242341 | 9/2005 |
| JP | 2006-215213 | 8/2006 |

OTHER PUBLICATIONS

Japanese Office Action dated Jun. 6, 2008 for corresponding Japanese Application No. 2006-222846.

* cited by examiner

*Primary Examiner* — Alexander Eisen
*Assistant Examiner* — Nelson Lam
(74) *Attorney, Agent, or Firm* — Rader, Fishman & Grauer PLLC

(57) ABSTRACT

An image display device includes: a pixel array part formed of first to fourth scanning lines arranged in rows, signal lines arranged in columns, pixel circuits in a matrix connected to the scanning lines and signal lines, and a plurality of power source lines which supplies first to third potentials necessary for the operations of pixel circuit; a signal part which supplies a video signal to the signal lines; and a scanner part which supplies a control signal to the first to fourth scanning lines, and in turn scans the pixel circuit for every row, wherein the pixel circuits include a sampling transistor, a drive transistor, first to third switching transistors, a pixel capacitance, and a light emitting device, and a channel length of the drive transistor is made longer than a channel length of the switching transistors to suppress fluctuations in threshold voltage.

6 Claims, 17 Drawing Sheets

CHANGE OVER TIME OF I-V CHARACTERISTICS OF LIGHT EMITTING DEVICE

———— : INITIAL STATE
------ : AFTER CHANGED OVER TIME

IMAGE DISPLAY DEVICE AND ELECTRONIC APPLIANCE

CROSS REFERENCES TO RELATED APPLICATIONS

The present invention contains subject matter related to Japanese Patent Application JP 2006-222846 filed in the Japanese Patent Office on Aug. 18, 2006, the entire contents of which being incorporated herein by reference.

BACKGROUND OF THE INVENTION

1. Field of the Invention

The present invention relates to an image display device which drives the current of a light emitting device arranged for every pixel for display. More specifically, the invention relates to a so-called active matrix image display device which controls the amount of current carried through a light emitting device such as an organic electroluminescent device with an insulating gate field effect transistor arranged in individual pixel circuits. In addition, the invention relates to an electronic appliance in which a display device like this is assembled therein.

2. Description of the Related Art

In image display devices such as a liquid crystal display, a large number of liquid crystal pixels are arranged in a matrix, the transmission intensity or the reflection intensity of incident lights is controlled for every pixel depending on image information to be displayed, and then an image is displayed. This is the same in an organic electroluminescent display in which an organic electroluminescent device is used for pixels, but the organic electroluminescent device is a self light emitting device different from the liquid crystal pixel. On this account, the organic electroluminescent display has higher image visibility than that of the liquid crystal display, and a back light is unnecessary, having advantages such as high response speed. In addition, the brightness level (gray scale) of individual light emitting devices can be controlled by the value of current carried therethrough. The organic electroluminescent display is greatly different from a voltage control display such as the liquid crystal display in that the organic electroluminescent display is a so-called current control display.

As similar to the liquid crystal display, the organic electroluminescent display has the drive modes as the simple matrix mode and the active matrix mode. The former has a simple structure, but has a problem that it is difficult to implement a display in large size and high definition. Thus, nowadays, the active matrix mode displays are being actively developed. In this mode, current carried through a light emitting device inside individual pixel circuits is controlled by an active device (generally a thin film transistor: TFT) disposed inside the pixel circuit, and this mode is described in JP-A-2003-255856, JP-A-2003-271095, JP-A-2004-133240, JP-A-2004-029791 and JP-A-2004-093682.

SUMMARY OF THE INVENTION

FIG. 11 shows a schematic diagram depicting an exemplary conventional pixel circuit. The pixel circuit is arranged at the portion at which a scanning line in rows which supplies control signals intersects a signal line SL in columns which supplies video signals, and the circuit includes a sampling transistor Tr1, a pixel capacitance Cs, a drive transistor Trd, and a light emitting device EL. The sampling transistor Tr1 conducts in accordance with the control signal supplied from the scanning line to sample the video signal supplied from the signal line SL. The pixel capacitance Cs holds the input voltage corresponding to the sampled video signal. The drive transistor Trd supplies an output current Ids in a predetermined light emission period in accordance with the input voltage held at the pixel capacitance Cs. Generally, the output current Ids has dependence on the carrier mobility $\mu$ and on the threshold voltage Vth of the channel region of the drive transistor Trd. The light emitting device EL emits light at the brightness corresponding to the video signal by the output current supplied from the drive transistor Trd. In addition, in the conventional example shown in FIG. 11, the pixel capacitance Cs is connected between a gate G of the drive transistor Trd and a power source potential Vcc. On the other hand, the anode of the light emitting device EL is connected to a source S of the drive transistor Trd, and the cathode thereof is grounded. A drain of the drive transistor Trd is connected to the power source potential Vcc.

The drive transistor Trd receives the input voltage held at the pixel capacitance Cs by the gate G, carries the output current Ids between the source S and the drain D, and carries current to the light emitting device EL. Generally, the emission brightness of the light emitting device EL is proportional to the amount of current carried. Moreover, the supply amount of the output current of the drive transistor Trd is controlled by the gate voltage Vgs, that is, by the input voltage written in the pixel capacitance Cs. In the pixel circuit, the input voltage to be applied to the gate G of the drive transistor Trd is varied in accordance with the input video signal to control the amount of current supplied to the light emitting device EL.

Here, the operating characteristic of the drive transistor is expressed by Equation (1) below.

$$Ids=(1/2)\mu(W/L)Cox(Vgs-Vth)2 \qquad (1)$$

In the Equation (1) for the transistor characteristics, Ids is the drain current carried between the source and the drain, and in the pixel circuit, it is the output current supplied to the light emitting device. Vgs is the gate voltage that is applied to the gate with reference to the source, and in the pixel circuit, it is the input voltage described above. Vth is the threshold voltage of the transistor. In addition, $\mu$ is the mobility of a semiconductor thin film configuring the channel of the transistor. In addition to this, W is the channel width, L is the channel length, and Cox is the gate capacitance. As apparent from Equation (1) for the transistor characteristics, in the case in which the thin film transistor operates in the saturation region, the gate voltage Vgs exceeds the threshold voltage Vth and increases, and then it is turned on to carry the drain current Ids. In principles, as expressed in Equation (1) for the transistor characteristics, if the gate voltage Vgs is constant, the same amount of the drain current Ids is supplied to the light emitting device at all times. Therefore, when video signals at the same level are supplied to all the individual pixels configuring the screen, all the pixels emit light at the same brightness, and the uniformity of the screen is supposed to obtain.

The drive current Ids necessary for the light emitting device formed of an organic electroluminescent device is as large as a few $\mu$A per pixel, an N-channel drive transistor having high mobility $\mu$ is desirable in order to reduce the amplitude of the video signal to intend low power consumption. The pixel circuit shown in FIG. 11 is a source follower type in which an N-channel transistor is used for the drive transistor Trd.

However, in the pixel circuit shown in FIG. 11, a problem arises that it is difficult to correct the deterioration of the current-voltage characteristic (the I-V characteristics) of the light emitting device EL. FIG. 12 shows a graph depicting the I-V characteristics of the light emitting device EL. The horizontal axis indicates the anode voltage Va of the light emitting device, and the vertical axis indicates the drive current Ids. In the circuit shown in FIG. 11, the anode potential Va is equal to the source potential of the drive transistor Trd, and the drive current is the drain current Ids carried through the drive transistor Trd. As shown in the graph in FIG. 12, the light emitting device such as an organic electroluminescent device is deteriorated in the I-V characteristics over time, and the characteristic curve is flattened over time. On this account, in the source follower pixel circuit shown in FIG. 11, in association with the deterioration of the I-V characteristics of the light emitting device, the operating point (source potential) of the drive transistor Trd is changed to cause image persistence.

In order to cope with the conventional problem, in recent years, a bootstrap pixel circuit is also proposed instead of the source follower pixel circuit. The bootstrap pixel circuit is configured in which the pixel capacitance is connected between the gate G and the source S of the drive transistor. In the bootstrap pixel circuit, since the gate voltage Vgs of the drive transistor Trd is maintained in the pixel capacitance all the time, even though the anode potential (that is, the source potential of the drive transistor) is changed due to the aging of the I-V characteristics of the light emitting device, the output current Ids corresponding to the gate voltage Vgs can be continuously carried through the light emitting device all the time without being affected by the I-V characteristics of the light emitting device EL. Thus, even though the I-V characteristics of the light emitting device are deteriorated, the degraded image quality will not occur such as the deterioration of the screen brightness, or image persistence.

In addition to fluctuations in the I-V characteristics of the light emitting device, the pixel circuit has variations in the characteristics of the drive transistor Trd depending on individual pixels. In reality, a thin film transistor (TFT) configured of a semiconductor thin film such as polysilicon has variations in the device characteristics of individual devices. Particularly, the threshold voltage Vth is not constant, and varies in every pixel. As apparent from Equation (1) for the transistor characteristics described above, when the threshold voltage Vth of each of the drive transistors is varied, the drain current Ids is varied even though the gate voltage Vgs is constant, and the brightness is varied in every pixel. Thus, the uniformity of the screen is impaired. Such a pixel circuit has been previously developed that incorporates the function of canceling variations in the threshold voltage of the drive transistor. For example, it is disclosed in JP-A-2004-133240.

However, even the pixel circuits having the bootstrap function that corrects the aging of the I-V characteristics of the light emitting device, and the function of canceling variations in the threshold voltage of the drive transistor (the threshold voltage correcting function) have problems that have to be solved. The threshold voltage correcting function can cancel the influence of the threshold voltage that affects the output current to be supplied to the light emitting device. However, the variations in the threshold voltage of the drive transistor Trd themselves adversely affect the bootstrap function, and impair the uniformity of the screen, which is desirable to be solved.

According to an embodiment of the invention, variations in the threshold voltage of the drive transistor are to be suppressed in order to obtain a screen of high uniformity. The embodiment of the invention is directed to an image display device including: a pixel array part; a scanner part; and a signal part, wherein the pixel array part is formed of: a first scanning line, a second scanning line, a third scanning line and a fourth scanning line arranged in rows, signal lines arranged in columns, pixel circuits in a matrix connected to the scanning lines and signal lines, and a plurality of power source lines which supplies first potential, second potential and third potential necessary for the operations of pixel circuit, the signal part supplies a video signal to the signal lines, the scanner part supplies a control signal to the first scanning line, the second scanning line, the third scanning line and the fourth scanning line, and in turn scans the pixel circuit for every row, each of the pixel circuits includes a sampling transistor, a drive transistor, a first switching transistor, a second switching transistor, a third switching transistor, a pixel capacitance, and a light emitting device, the sampling transistor conducts in response to the control signal supplied from the first scanning line in a predetermined sampling period, and samples the signal potential of the video signal supplied from the signal line to the pixel capacitance, the pixel capacitance applies input voltage to a gate of the drive transistor in accordance with the signal potential of sampled video signal, the drive transistor supplies output current in accordance with the input voltage to the light emitting device, the light emitting device emits light at brightness in accordance with the signal potential of the video signal with the output current supplied from the drive transistor for a predetermined light emission period, the first switching transistor conducts in response to the control signal supplied from the second scanning line prior to the sampling period, and sets the gate of the drive transistor to the first potential, the second switching transistor conducts in response to control signal supplied from the third scanning line prior to the sampling period, and sets a source of the drive transistor to the second potential, and the third switching transistor conducts in response to control signal supplied from the fourth scanning line prior to the sampling period, and connects the drive transistor to the third potential, whereby it allows voltage corresponding to the threshold voltage of the drive transistor to be held in the pixel capacitance to correct the influence of threshold voltage, as well as it again conducts in response to the control signal supplied from the fourth scanning line in the light emission period, and connects the drive transistor to the third potential to carry the output current through the light emitting device, in which a channel length of the drive transistor is made longer than a channel length of the individual switching transistors to suppress fluctuations in threshold voltage.

In addition, an embodiment of the invention is an image display device including: a pixel array part; a scanner part; and a signal part, wherein the pixel array part is formed of: a first scanning line, a second scanning line, a third scanning line and a fourth scanning line arranged in rows, signal lines arranged in columns, pixel circuits in a matrix connected to the scanning lines and signal lines, and a plurality of power source lines which supplies first potential, second potential and third potential necessary for the operations of pixel circuit, the signal part supplies a video signal to the signal lines, the scanner part supplies a control signal to the first scanning line, the second scanning line, the third scanning line and the fourth scanning line, and in turn scans the pixel circuit for every row, each of the pixel circuits includes a sampling transistor, a drive transistor, a first switching transistor, a second switching transistor, a third switching transistor, a pixel capacitance, and a light emitting device, the sampling transistor conducts in response to the control signal supplied from the first scanning line in a predetermined sampling period, and samples the signal potential of the video signal supplied from the signal line to the pixel capacitance, the pixel capacitance applies input voltage to a gate of the drive transistor in accordance with the signal potential of sampled video signal, the drive transistor supplies output current in accordance with the input voltage to the light emitting device, the light emitting device emits light at brightness in accordance with the signal potential of the video signal with the output current supplied from the drive transistor for a predetermined light emission period, the first switching transistor conducts in response to the control signal supplied from the second scanning line prior to the sampling period, and sets the gate of the drive transistor to the first potential, the second switching transistor conducts in response to control signal supplied from the third scanning line prior to the sampling period, and sets a source of the drive transistor to the second potential, and the third switching transistor conducts in response to control signal supplied from the fourth scanning line prior to the sampling period, and connects the drive transistor to the third potential, whereby it allows voltage corresponding to the threshold voltage of the drive transistor to be held in the pixel capacitance to correct the influence of threshold voltage, as well as it again conducts in response to the control signal supplied from the fourth scanning line in the light emission period, and connects the drive transistor to the third potential to carry the output current through the light emitting device, in which the scanner part is formed on a same substrate as the pixel array part is formed, and a channel length of the drive transistor is made longer than a channel length of the transistors configuring the scanner part to suppress fluctuations in threshold voltage.

Preferably, the channel length of the drive transistor is set to 10 μm or greater. In addition, in the pixel circuit, the channel length of the drive transistor is set so that during the light emission period, the source potential of the drive transistor is varied, whereas the input voltage applied to the gate of the drive transistor is not varied with reference to the source potential. In addition, in the drive transistor, its output current has dependence on a carrier mobility in a channel region, and the third switching transistor conducts during the sampling period and connects the drive transistor to the third potential, takes the output current out of the drive transistor while the signal potential is being sampled, and applies the negative feedback of the output current to the pixel capacitance to correct the input voltage, whereby the dependence of the output current on the carrier mobility is cancelled.

According to an embodiment of the invention, the channel length of the drive transistor is made longer to suppress variations in the threshold voltage. With this configuration, variations are reduced in the gain in the bootstrap operation, and the uniformity of the screen can be improved significantly. More specifically, the channel length of the drive transistor is made longer than the channel length of the individual switching transistors, and the variations in the threshold voltage are suppressed. As compared with such a switching transistor that operates in the linear region as a mere switch, the threshold voltage of the drive transistor that operates in the saturation region in accordance with Equation (1) for the characteristics greatly affects the uniformity of the screen, and thus this configuration is effective. In addition, the channel length of the drive transistor is made longer than the channel length of the transistors configuring the peripheral scanner to suppress the variations in the threshold voltage, which is also effective. In the case in which the pixel array part and the scanner part are formed on the same substrate by TFT processes, the variations in the threshold voltage of the drive transistor greatly affect the uniformity of the screen, and thus it is effective that the channel length of the transistor of the scanner part is made much longer. In any cases, the channel length of the drive transistor is preferably set to 10 μm or greater, whereby the range of the variations in the threshold voltage can be suppressed to such a level that does not affect the uniformity of the screen.

DETAILED DESCRIPTION OF THE INVENTION

Figure 1:
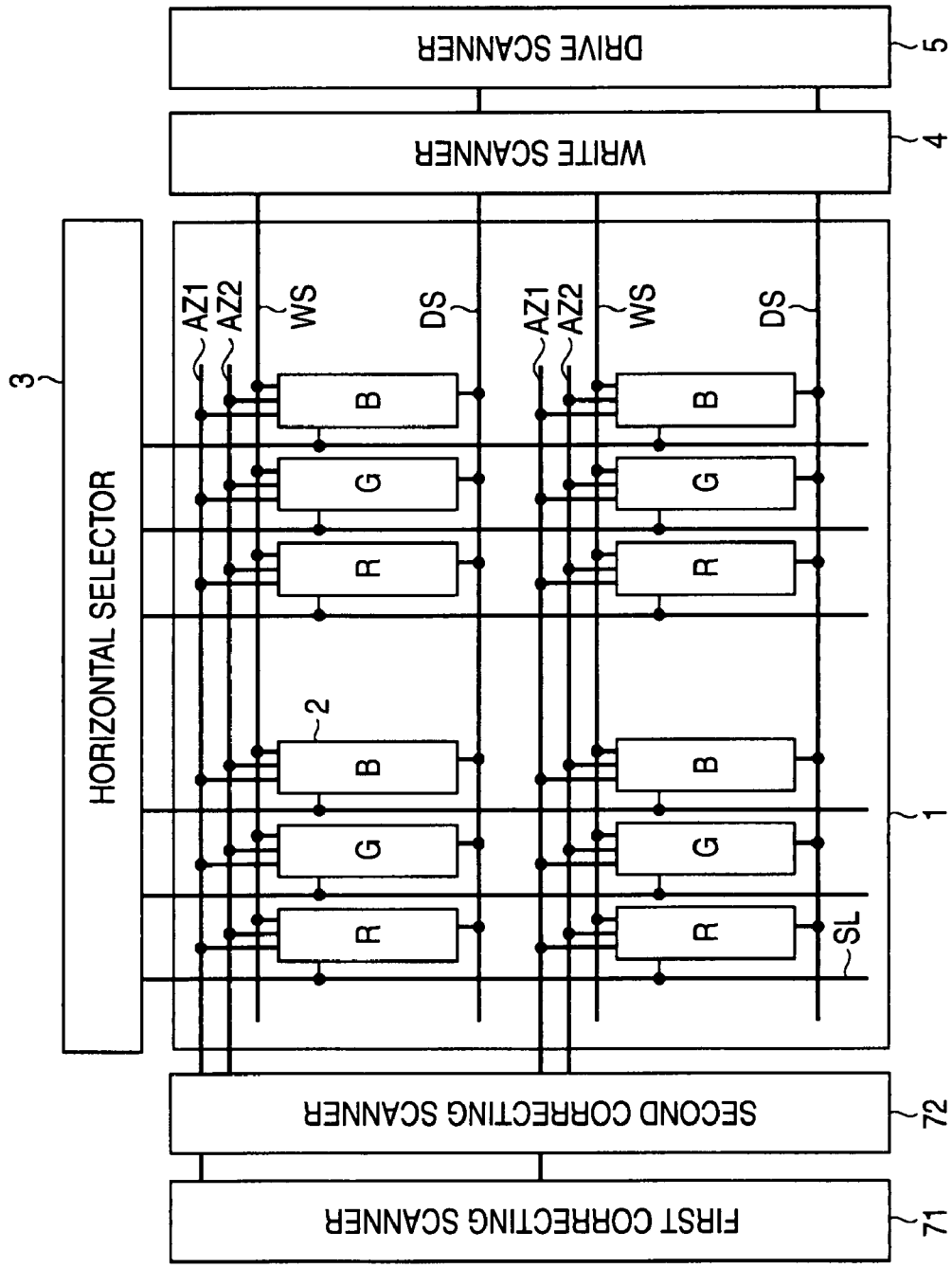
FIG. 1 shows a block diagram depicting the overall configuration of an image display device according to an embodiment of the invention.

Hereinafter, an embodiment of the invention will be described in detail with reference to the drawings. FIG. 1 shows a block diagram depicting the overall configuration of an image display device according to an embodiment of the invention. As shown in the drawing, the image display device is basically configured of a pixel array part 1, a scanner part and a signal part. The pixel array part 1 is configured of first scanning lines WS, second scanning line AZ1, third scanning lines AZ2 and fourth scanning lines DS arranged in rows, and signal lines SL arranged in columns, and pixel circuits 2 arranged in a matrix which are connected to the scanning lines WS, AZ1, AZ2 and DS and the signal lines SL, and a plurality of power source lines which supplies a first potential Vss1, a second potential Vss2 and a third potential Vcc necessary for the operation of the individual pixel circuits 2. The signal part is configured of a horizontal selector 3, which supplies video signals to the signal lines SL. The scanner part is configured of a write scanner 4, a drive scanner 5, a first correcting scanner 71 and a second correcting scanner 72, and they supply control signals to the first scanning lines WS, the fourth scanning lines DS, the second scanning lines AZ1 and the third scanning lines AZ2, and in turn scans the pixel circuits for every row.

Figure 2:
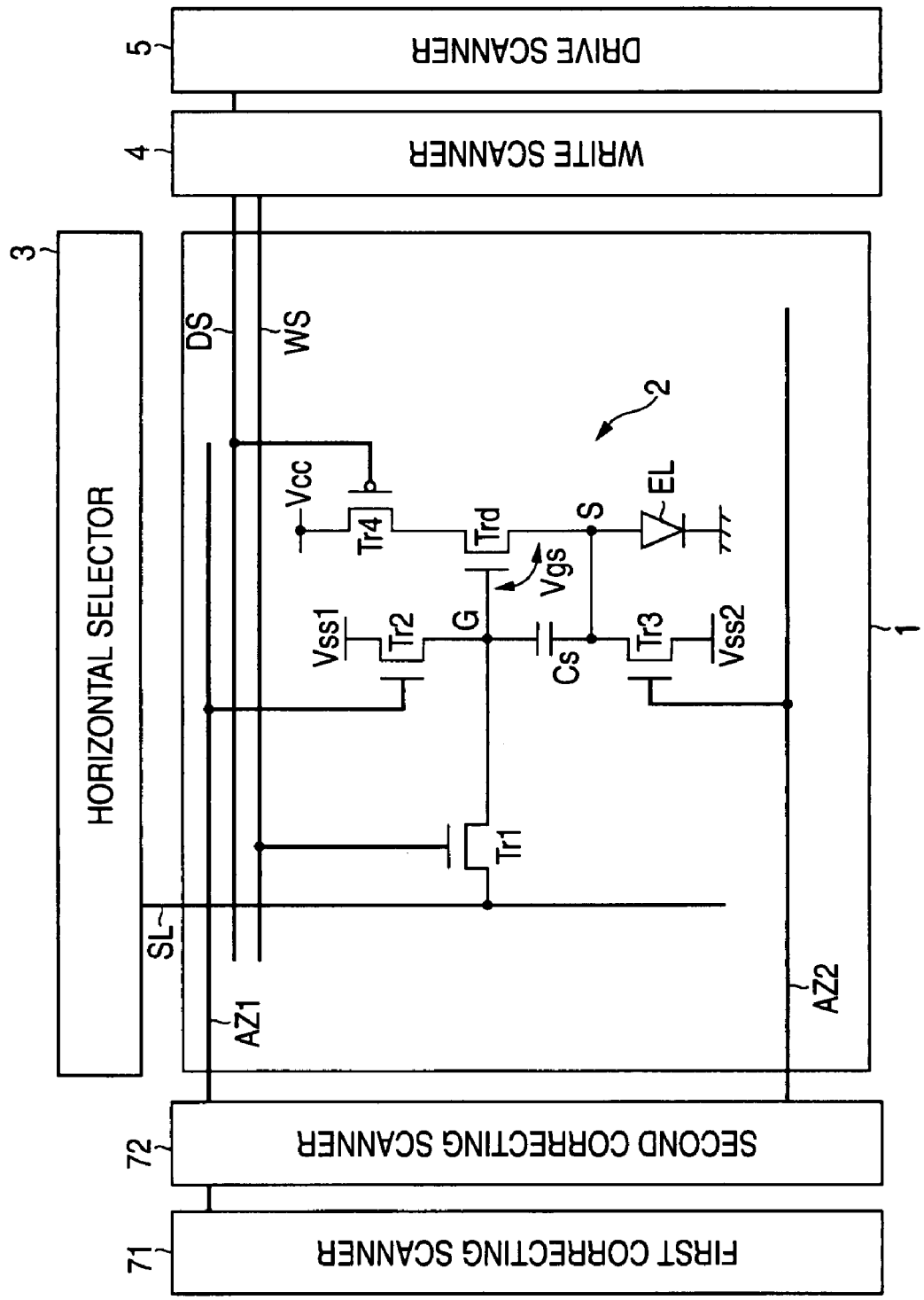
FIG. 2 shows a circuit diagram depicting a pixel formed in the image display device shown in FIG. 1.

FIG. 2 shows a circuit diagram depicting an exemplary configuration of the pixel circuit incorporated in the image display device shown in FIG. 1. As shown in the drawing, the pixel circuit 2 includes a sampling transistor Tr1, a drive transistor Trd, a first switching transistor Tr2, a second switching transistor Tr3, a third switching transistor Tr4, a pixel capacitance Cs, and a light emitting device EL. The sampling transistor Tr1 conducts in response to the control signal supplied from the first scanning line WS in a predetermined sampling period, and samples the signal potential of the video signal supplied from the signal line SL into the pixel capacitance Cs. The pixel capacitance Cs applies the input voltage Vgs to the gate G of the drive transistor Trd in accordance with the signal potential of the sampled video signal. The drive transistor Trd supplies the output current Ids corresponding to the input voltage Vgs to the light emitting device EL. The light emitting device EL emits light at the brightness corresponding to the signal potential of the video signal with the output current Ids supplied from the drive transistor Trd during a predetermined light emission period.

Prior to the sampling period, the first switching transistor Tr2 conducts in response to the control signal supplied from the second scanning line AZ1, and sets the gate G of the drive transistor Trd to the first potential Vss1. Prior to the sampling period, the second switching transistor Tr3 conducts in response to the control signal supplied from the third scanning line AZ2, and sets the source S of the drive transistor Trd to the second potential Vss2. Prior to the sampling period, the third switching transistor Tr4 conducts in response to the control signal supplied from the fourth scanning line DS, and connects the drive transistor Trd to the third potential Vcc, whereby it allows the voltage corresponding to the threshold voltage Vth of the drive transistor Trd to be held in the pixel capacitance Cs, and corrects the influence of the threshold voltage Vth. Moreover, the third switching transistor Tr4 again conducts in response to the control signal supplied from the fourth scanning line DS during the light emission period, connects the drive transistor Trd to the third potential Vcc, and carries the output current Ids through the light emitting device EL.

As apparent from the description above, the pixel circuit 2 is configured of five transistors Tr1 to Tr4 and Trd, a single pixel capacitance Cs and a single light emitting device EL. The transistors Tr1 to Tr3 and Trd are an N-channel polysilicon TFT. Only the transistor Tr4 is a P-channel polysilicon TFT. However, an embodiment of the invention is not restricted thereto, which may freely mix N-channel and P-channel TFTs. For example, the light emitting device EL is a diode organic electroluminescent device having an anode and a cathode. However, an embodiment of the invention is not restricted thereto, and the light emitting device includes all the devices that emit light driven with current in general.

Figure 3:
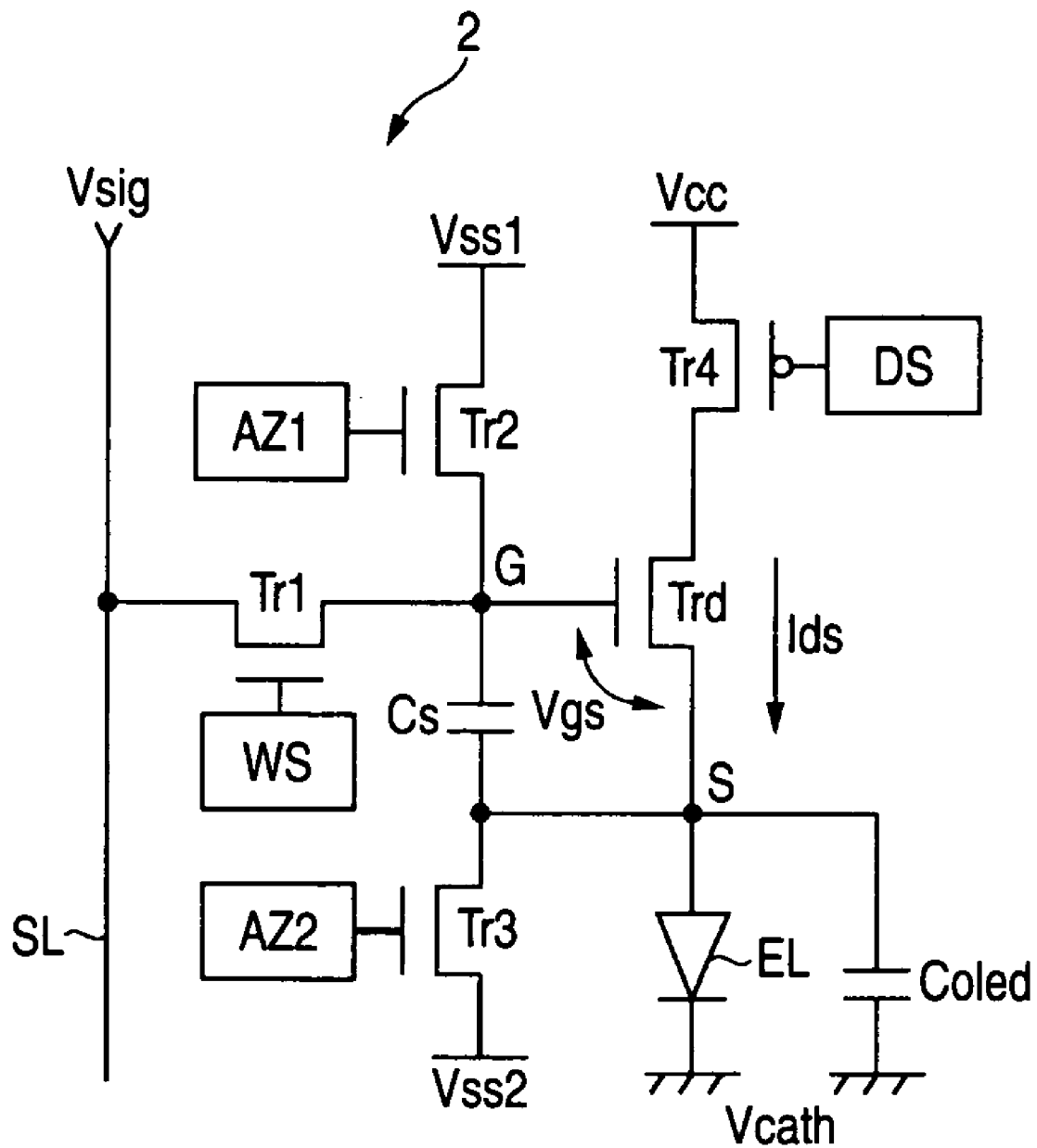
FIG. 3 shows a schematic diagram illustrative of the operation of the pixel circuit shown in FIG. 2.

FIG. 3 shows a schematic diagram depicting that only the part of the pixel circuit 2 is taken out of the image display device shown in FIG. 2. For the sake of clarity, the video signal Vsig sampled by the sampling transistor Tr1, the input voltage Vgs and the output current Ids of the drive transistor Trd, and the capacitance component Coled of the light emitting device EL are added. Hereinafter, the operation of the pixel circuit 2 will be described with reference to FIG. 3.

Figure 4:
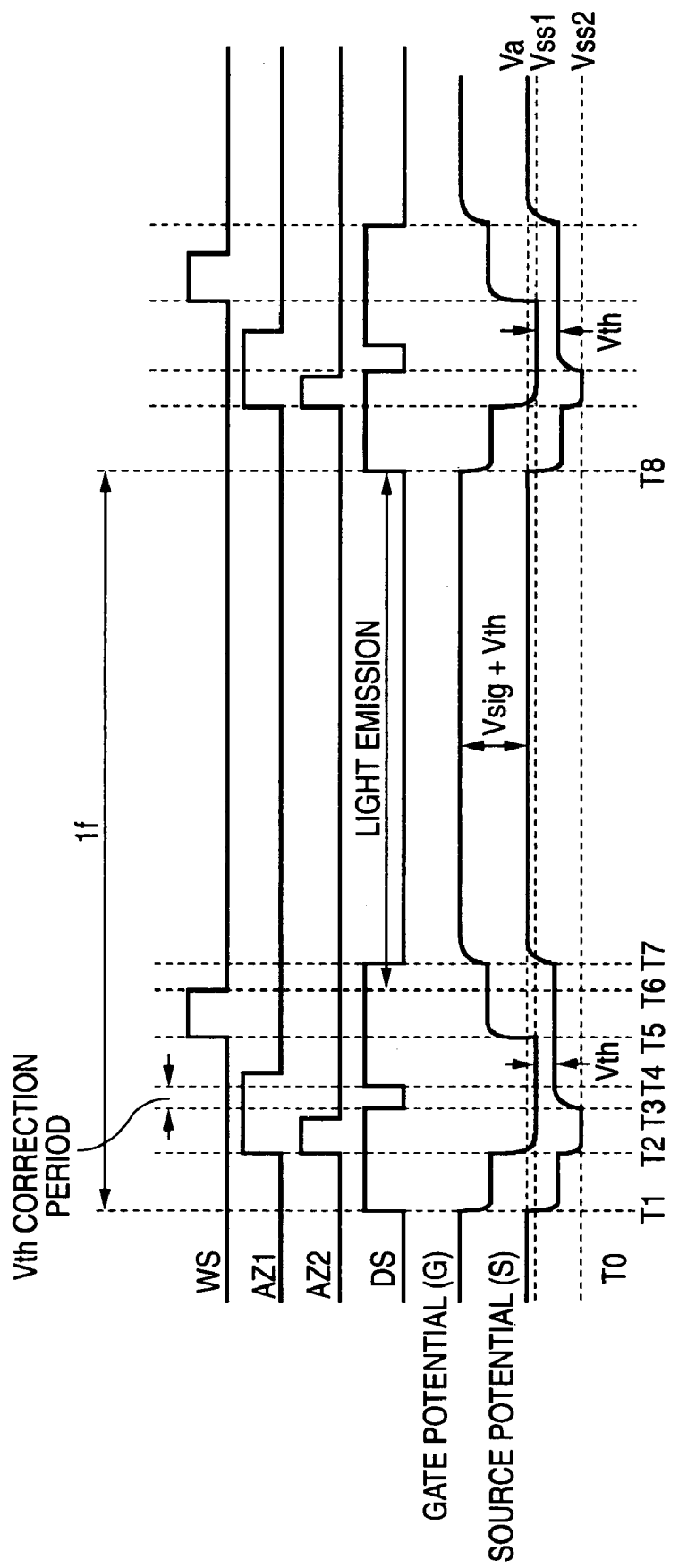
FIG. 4 shows a timing chart illustrative of the operation of the image display device shown in FIGS. 2 and 3.

FIG. 4 shows a timing chart depicting the pixel circuit shown in FIG. 3. The operation of the pixel circuit shown in FIG. 3 will be described more specifically with reference to FIG. 4. FIG. 4 shows the waveforms of the control signals applied to the scanning lines WS, AZ1, AZ2 and DS along a time base T. For simplifying the notation, the control signals are denoted by the same signs as the signs of the corresponding scanning lines. Since the transistors Tr1, Tr2 and Tr3 are the N-channel type, they are turned on when the scanning lines WS, AZ1 and AZ2 are at the high level, and turned off when at the low level. On the other hand, since the transistor Tr4 is the P-channel type, it is turned off when the scanning line DS is at the high level, and turned on when at the low level. In addition, this timing chart also shows the waveforms of the control signals WS, AZ1, AZ2 and DS as well as the potential changes in the gate G and the source S of the drive transistor Trd.

In the timing chart shown in FIG. 4, the period of timings from T1 to T8 is a single field (1f). During the single field, each row of the pixel array is in turn scanned for one time. The timing chart shows the waveforms of the control signals WS, AZ1, AZ2 and DS that are applied to a single row of pixels.

At timing T0 before the field is started, all the control signals WS, AZ1, AZ2 and DS are at the low level. Therefore, the N-channel transistors Tr1, Tr2 and Tr3 are in the OFF state, whereas only the P-channel transistor Tr4 is in the ON state. Thus, since the drive transistor Trd is connected to the power source Vcc through the transistor Tr4 in the ON state, it supplies the output current Ids to the light emitting device EL in accordance with a predetermined input voltage Vgs. Therefore, the light emitting device EL emits light at timing T0. At this time, the input voltage Vgs to be applied to the drive transistor Trd is expressed by the difference between the gate potential (G) and the source potential (S).

At timing T1 at which the field is started, the control signal DS is switched from the low level to the high level. Thus, since the transistor Tr4 is turned off and the drive transistor Trd is separated from the power source Vcc, the light emission is stopped into the non emission period. Therefore, when the period enters timing T1, all the transistors Tr1 to Tr4 are in the OFF state.

Subsequently, when it goes to timing T2, the control signals AZ1 and AZ2 are at the high level, and then the switching transistors Tr2 and Tr3 are turned on. Consequently, the gate G of the drive transistor Trd is connected to the reference potential Vss1, and the source S is connected to the reference potential Vss2. Here, Vss1−Vss2>Vth is satisfied, and Vss1−Vss2=Vgs>Vth is made, and after that, Vth correction to be done at timing T3 is prepared. In other words, the period from T2 to T3 corresponds to the reset period of the drive transistor Trd. In addition, when the threshold voltage of the light emitting device EL is VthEL, it is set to VthEL>Vss2. Thus, a negative bias is applied to the light emitting device EL, and the state is turned to a so-called reverse bias state. The reverse bias state is necessary to successfully perform the Vth correction operation and the mobility correcting operation.

At timing T3, the control signal AZ2 is turned to the low level, and right after this, the control signal DS is also turned to the low level. Thus, the transistor Tr3 is turned off, and the transistor Tr4 is turned on. Consequently, the drain current Ids is carried through the pixel capacitance Cs to start the Vth correction operation. At this time, the gate G of the drive transistor Trd is held at Vss1, and the current Ids is carried until the drive transistor Trd is cut off. When it is cut off, the source potential (S) of the drive transistor Trd is turned to Vss1−Vth. At timing T4 after the drain current is cut off, the control signal DS is again turned to the high level to cut off the switching transistor Tr4. Moreover, the control signal AZ1 is also returned to the low level, and the switching transistor Tr2 is also turned off. Consequently, Vth is held and fixed to the pixel capacitance Cs. As described above, the period from T3 to T4 is the period to detect the threshold voltage Vth of the drive transistor Trd. Here, the detecting period from T3 to T4 is called a Vth correction period.

As described above, after Vth correction is performed, the control signal WS is switched to the high level at timing T5, and the sampling transistor Tr1 is turned on to write the video signal Vsig to the pixel capacitance Cs. The pixel capacitance Cs is smaller enough than the equivalent capacitance Coled of the light emitting device EL. Consequently, most of the video signal Vsig is written to the pixel capacitance Cs. Precisely, Vsig−Vss1, the difference of Vsig from Vss 1, is written to the pixel capacitance Cs. Therefore, the voltage Vgs between the gate G and the source S of the drive transistor Trd is the level (Vsig−Vss1+Vth) that Vth detected and held before is added to Vsig−Vss1 sampled at this time. Hereinafter, for simplified description, when it is Vss1=0 V, the voltage Vgs between the gate and the source is Vsig+Vth as shown in the timing chart in FIG. 4. The sampling of the video signal Vsig is performed until timing T6 at which the control signal WS is returned to the low level. In other words, the period from T5 to T6 corresponds to the sampling period.

Subsequently, the control signal DS is turned to the low level at timing T7, and the switching transistor Tr4 is turned on. Thus, since the drive transistor Trd is connected to the power source Vcc, the pixel circuit goes from the non emission period to the light emission period. At the preceding timing T6, the control signal WS is turned to the low level, and the sampling transistor Tr1 is already turned off. On this account, the gate G of the drive transistor Trd is separated from the signal line SL. Since the application of the video signal Vsig is released, upon turning on the switching transistor Tr4, the gate potential (G) of the drive transistor Trd is allowed to rise, and it rises together with the source potential (S). In addition, in the pixel circuit according to the embodiment, the source of the drive transistor Trd is connected to the anode of the light emitting device EL. On this account, the source potential (S) of the drive transistor Trd is the anode potential Va of the light emitting device EL at the same time. The timing chart shown in FIG. 4 also shows the anode potential Va of the light emitting device EL. The light emission period is finished at timing T8 before entering the subsequent field.

As described above, at timing T7, the gate potential (G) of the drive transistor Trd is allowed to rise, and the source potential (S) also rises together. This is the bootstrap operation. During the bootstrap operation, the voltage Vgs between the gate and the source held in the pixel capacitance Cs maintains the value of (Vsig+Vth). In other words, the bootstrap operation is that the anode potential Va of the light emitting device EL is allowed to rise while Vgs held in the pixel capacitance Cs is being maintained at constant. In association with the rise of the source potential of the drive transistor (S), that is, the rise of the anode potential Va of the light emitting device EL, the reverse bias state of the light emitting device EL is cancelled, and then the output current Ids flows to actually start the light emission of the light emitting device EL. The relation between the drain current Ids and the gate voltage Vgs at this time is given as Equation (2) below by substituting Vsig+Vth into Vgs of Equation (1) for the transistor characteristics above.

$$Ids = k \cdot \mu (Vgs-Vth)2 = K \cdot \mu (Vsig)2 \qquad (2)$$

In Equation (2), k=(1/2)(W/L)Cox. It is revealed from Equation (2) for the characteristics that the term Vth is cancelled and the output current Ids to be supplied to the light emitting device EL does not depend on the threshold voltage Vth of the drive transistor Trd. Basically, the drain current Ids is determined by the signal voltage Vsig of the video signal. In other words, the light emitting device EL is to emit light at the brightness in accordance with the video signal Vsig. In addition to this, the pixel circuit maintains the gate voltage Vgs at constant all the time without depending on the source potential of the drive transistor, that is, the anode potential Va of the light emitting device. Because of the bootstrap function, the pixel circuit can stably maintain the screen brightness with no influence of the changes over time in the I-V characteristics of the light emitting device EL.

Figure 5:
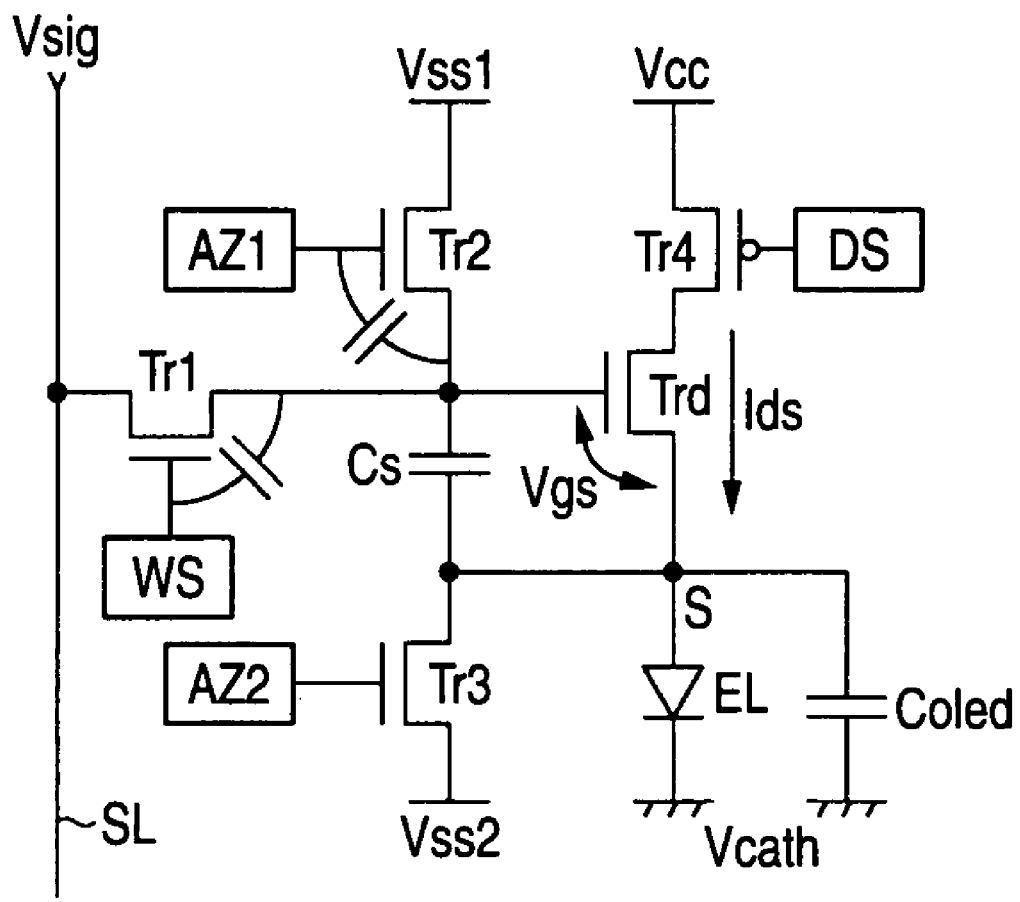
FIG. 5 shows a schematic circuit diagram illustrative of the image display device according to an embodiment of the invention.

As described above, even the pixel circuit having the bootstrap function and the threshold voltage correcting function incorporated therein still has a problem to be solved. Prior to describing an embodiment of the invention, this point will be described with reference to FIG. 5. FIG. 5 shows a schematic diagram depicting a single pixel circuit taken out of the image display device shown in FIG. 2. Basically, it is the same as the schematic diagram depicting the pixel circuit shown in FIG. 3, but the parasitic capacitance Cp is also added for the convenience of the description. In the thin film transistor, the parasitic capacitance Cp exists between the gate and the source. Particularly in the pixel circuit, the parasitic capacitance Cp of the sampling transistor Tr1 or the switching transistor Tr2 adversely affects the operation of the drive transistor Trd. More specifically, the parasitic capacitance Cp of the transistors Tr1 and Tr2 causes a voltage loss in the bootstrap operation, and this is involved in the variations in the threshold voltage Vth of the drive transistor Trd to cause the brightness difference on the screen. In the ideal bootstrap operation, a rise of the source potential of the drive transistor is perfectly equal to a rise of the gate potential, and the gate voltage Vgs is maintained at constant. In other words, it is ideal that the bootstrap gain is one. However, actually, a loss occurs in the bootstrap gain because of the influence of the parasitic capacitance Cp, and the gate potential has a smaller rise than that of the source potential by that amount. The problem here is that a loss in the bootstrap gain is not constant among the pixels and it is varied by receiving the influence of the threshold voltage of the drive transistor Vth of the individual pixel circuits. Because of the variations in the loss in the bootstrap gain, the brightness difference occurs among the pixels on the screen to impair the uniformity.

Further with reference to FIG. 5, the loss in the bootstrap gain will be described in detail. Since the voltage Vgs between the gate and the source of the drive transistor Trd after the signal voltage Vsig is written has been subjected for Vth correction in advance, it is as below.

$$Vgs = Vsig - Vss1 + Vth$$

Subsequently, the sampling transistor Tr1 is turned off, and then the switching transistor Tr4 is turned on, whereby the drive transistor Trd is connected to the power source Vcc, and the drain current Ids is carried through the light emitting device EL. At this time, the voltage corresponding to the drain current Ids is applied to the anode terminal of the light emitting device EL. In the timing chart shown in FIG. 4, the anode voltage (the source voltage of the drive transistor) at this time is denoted by Va. Thus, when the light emission operation, the source voltage of the drive transistor rises by Va−Vss1+Vth. On the other hand, since the gate voltage of the drive transistor Trd has the parasitic capacitance Cp, its rise is as below:

$$(Va-Vss1+Vth) \times Cs/(Cs+Cp).$$

AS described above, Vgs after the bootstrap operation is expressed by Equation (3) below. In addition, the drain current Ids corresponding to this Vgs is given by Equation (4) below. However, in Equation (3), Vss1 is 0 V for simplified description.

$$Vgs = Vsig - Vss1 + Vth - (Va - Vss1 + Vth) \cdot Cp/(Cs+Cp) \quad (3)$$
$$= Vsig + Vth - (Va + Vth) \cdot Cp/(Cs+Cp)$$

$$Ids = k \cdot \mu (Vsig - (Va+Vth) \cdot Cp/(Cs+Cp))2 \quad (4)$$

Equation (3) expressing Vgs after bootstrap includes the loss in the bootstrap gain in the third term, having a smaller value than an ideal one. In the term of the loss in the bootstrap gain, variables Va and Vth are included as Cp/(Cs+Cp) are coefficients. Generally, since the light emitting device characteristics are not varied so much among the pixels, variations in the anode potential Va can be ignored. In contrast to this, the threshold voltage of the drive transistor Vth varies for every pixel. On this account, the term of the loss in the bootstrap gain is varied for every pixel, and the emission brightness is not uniform among the pixels.

Generally, the pixel capacitance Cs is about 200 fF, and the parasitic capacitance Cp is about 5 fF. Thus, the loss in the bootstrap gain Cp/(Cs+Cp) is about 2.5%. On this account, variations of about 2.5% of Vth variations are inevitably included in the light emitting current Ids expressed in Equation (4). For example, suppose the width between the maximum and the minimum of the Vth variations of the drive transistor Trd is 2 V, the Vgs variations caused by the loss in the bootstrap gain are 50 mV. Here, suppose Vgs=2V in white display in which the screen uniformity is most noticeable, the brightness variations caused by the difference of 50 mV are about 5%, which can be visually seen. Therefore, the yields of the panel are decreased. Generally, on the fabrication processes, the variations in Vth of the drive transistor are distributed in streaks on the screen. Thus, unevenness in streaks occurs on the screen, causing a reduction in the yields of the panel.

Figure 6:
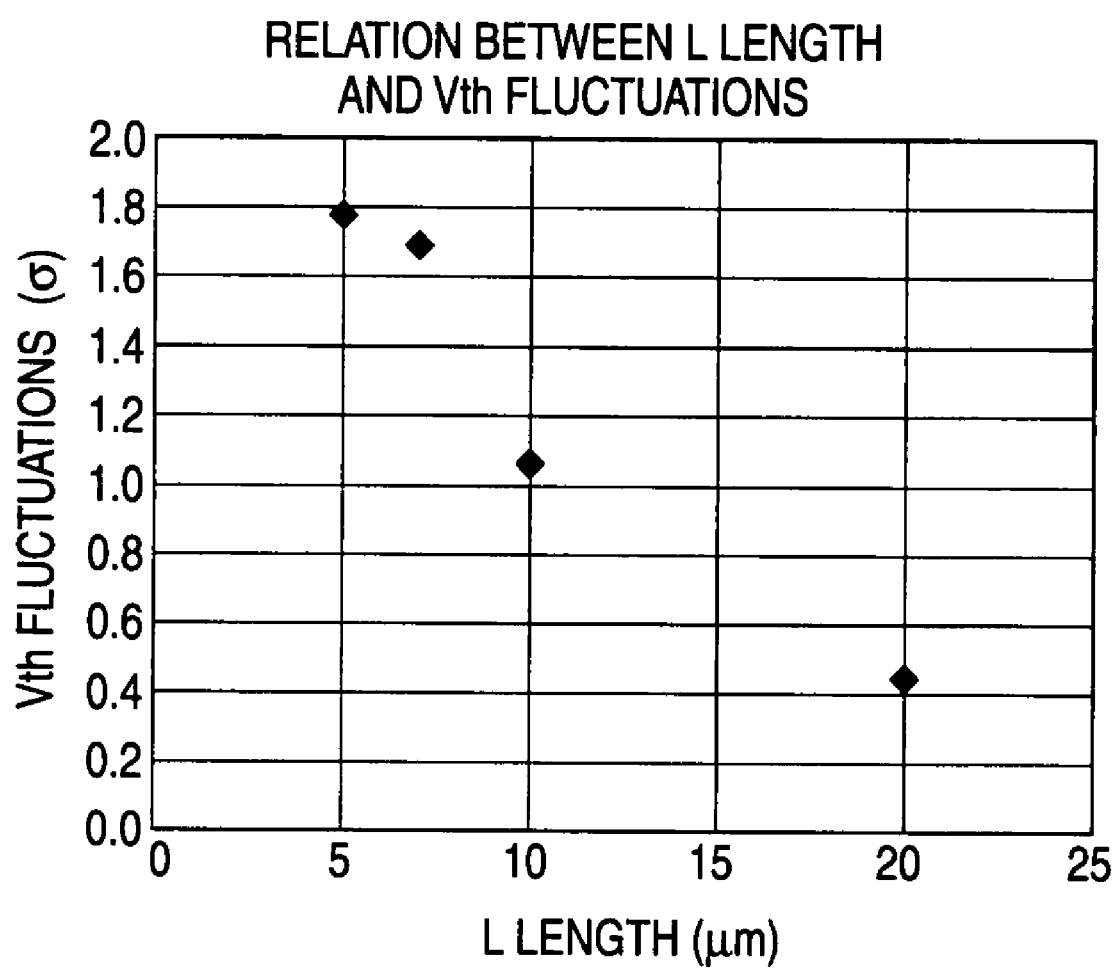
FIG. 6 shows a graph illustrative of the image display device according to an embodiment of the invention.

As apparent from the study described above, since the pixel circuit has the parasitic capacitance Cp, in principles it is inevitable to have the loss in the bootstrap gain. Suppose the loss in the bootstrap gain uniformly occurs in every pixel, for the entire screen, the brightness is merely slightly reduced, but image quality is not adversely affected. However, since each of the pixels has the variations in the threshold voltage of the drive transistor Vth, the loss in the bootstrap gain is affected by this and varied among the pixels. Then, in an embodiment of the invention, in order to suppress the variations in the loss in the bootstrap gain among the pixels, the Vth variations in the drive transistor of each of the pixels are suppressed. More specifically, the channel length L of the drive transistor Trd is designed long that controls the light emitting current Ids of the light emitting device EL, whereby the variations in the threshold voltage of the drive transistor Vth can be suppressed. This point will be described with reference to a graph shown in FIG. 6. FIG. 6 shows a graph depicting the relation between the length L of the thin film transistor and the Vth variations. The horizontal axis indicates the length L, and the vertical axis indicates the Vth variations (deviations). As apparent from the graph, in the thin film transistor having a polycrystalline silicon film as a device area, the longer the length L is, the smaller the Vth variations are. The polycrystalline silicon film is formed of a collection of silicon crystal grains, which locally has variations in the distribution of crystal grains. The channel length that is the direction of carrying current is prolonged, whereby the variations in the distribution of crystal grains are averaged, and the variations in the threshold voltage are reduced by that amount.

Generally, the drive current necessary for the light emitting device such as an organic electroluminescent device is as large as a few µA per pixel. In order to decrease the amplitude of the input video signal and to intend the low power consumption, the size ratio W/L of the drive transistor Trd is set as large as possible to enhance the current drive performance. On the other hand, it is preferable to reduce the pixel size for a high definition panel, and thus it is also preferable that the device area of the drive transistor Trd is small. Therefore, in order to design the drive transistor Trd to have the size ratio as large as possible and a smaller device area, generally, it tends to design a shorter length L (the channel length) of the drive transistor Trd. However, in TFTs having low temperature polysilicon in the device area, as shown in FIG. 6, the variations in the Vth characteristics are deteriorated as the length L of the drive transistor becomes shorter. Suppose the length L of the drive transistor Trd is designed short, because of the variations in the Vth characteristics, even though the influence of Vth is removed from the drain current Ids in the operation of canceling Vth, the Vth variations caused by the loss in the bootstrap gain are seen on the screen, causing the deteriorated uniformity. As apparent from Equation (3) described above, in such a pixel having Vth of the drive transistor Trd greater than that of the surrounding pixels, the brightness is relatively reduced more than that of the surrounding pixel, whereas in a pixel having a smaller Vth than that of the surrounding pixels, the brightness is relatively high. On this account, unevenness like streaks occurs on the screen.

For the measures against image quality defectives, in an embodiment of the invention, the length L of the drive transistor Trd is set long. More specifically, preferably, the length L of the drive transistor Trd is designed to be 10 µm or greater. In the case in which the length L is 10 µm or greater, as apparent from the graph shown in FIG. 6, the Vth variations are within 1 V. Here, in the case in which the loss in the bootstrap gain is 2.5%, the Vgs variations caused by the loss in the bootstrap gain are 25 mV. Suppose the gate voltage Vgs=2V that is applied to the drive transistor Trd in the white gray scale, the brightness difference caused by the variations is 2.5% by Equation (3). Generally, since the brightness difference visible in the uniformity in the white gray scale is 2 to 3%, the length L is designed to be 10 µm or greater, which allows that the brightness variations caused by the loss in the bootstrap gain can be such level that can hardly visibly seen. Thus, the yields of fabricating the panel can be improved. As apparent from the graph shown in FIG. 6, in order to achieve high image quality, it is desirable that the length L of the drive transistor Trd is preferably longer from 15 µm to 20 µm.

In addition, depending on the scale factor of the pixel circuit, it is sometimes difficult to define the length L of the drive transistor Trd by absolute numeric values. Also in this case, it is effective that the channel length L of the drive transistor Trd is made longer than the channel length of the switching transistors Tr2, Tr3 and Tr4 and the variations in the threshold voltage Vth are suppressed. The variations in the threshold voltage Vth of the drive transistor Trd greatly affect the brightness through the loss in the bootstrap gain. Then, it is effective that the channel length L of the drive transistor is set longer than that of the other switching devices configuring the pixel in order to suppress the brightness variations. In addition, in the panel using low temperature polysilicon TFTs, the scanner part is sometimes integrated and formed as well in the same low temperature polysilicon TFT process in addition to the pixel array part. In this case, it is effective that the channel length L of the drive transistor Trd included in each of the pixels of the pixel array part is made longer than the channel length of the transistor configuring the scanner part and the variations in the threshold voltage Vth are suppressed. The threshold voltage of the drive transistor greatly affects the brightness of the pixel, and it is effective that the channel length is made longer than the channel length of the transistor of the scanner part in order to enhance the uniformity of the screen.

Figure 7:
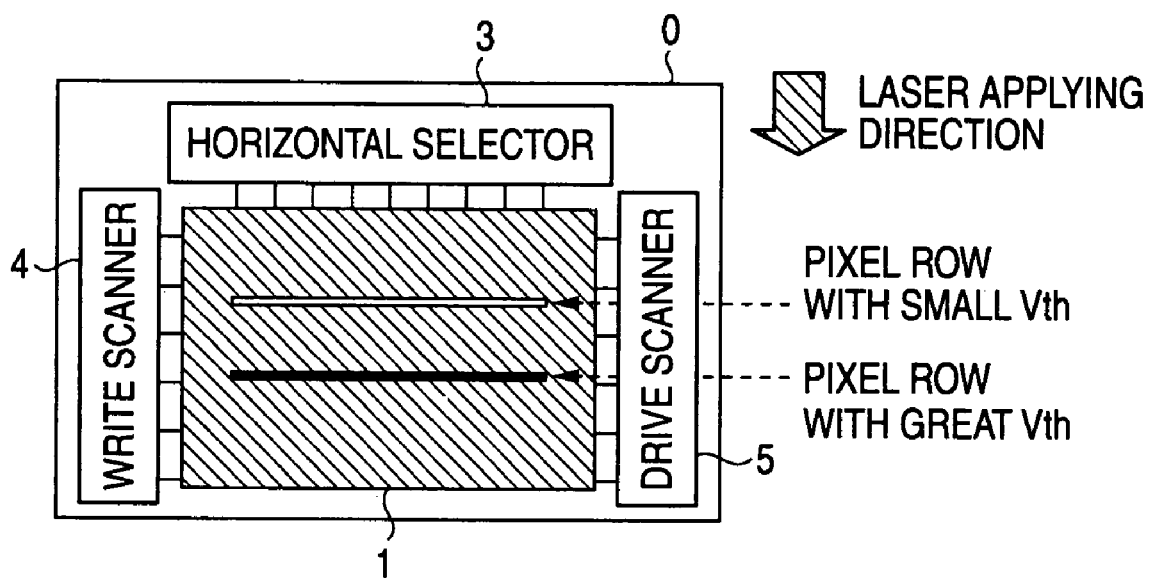
FIG. 7 shows a schematic diagram illustrative of depicting the image display device according to an embodiment of the invention.

FIG. 7 shows a schematic diagram depicting causes that the Vth variations occur in the drive transistor. As shown in the drawing, a display device is formed of a single insulating substrate, which is a flat panel 0. On the panel 0, a pixel array part 1 is formed as well as a write scanner 4, a drive scanner 5, and a horizontal selector 3 in peripherals are integrated and formed. As similar to the pixel array part 1 at the center, these peripheral drive parts are integrated and formed of thin film transistors. Generally, the thin film transistor has a polycrystalline silicon film as the device area. For example, for the polycrystalline silicon film, an amorphous silicon thin film is deposited on an insulating substrate, laser beams are applied thereonto for crystallization, and then the film is transformed into a polysilicon thin film. For example, for the application of laser beams, line laser beams are applied while the films are in turn laminated on the panel 0 from above to below, whereby the amorphous silicon film is transformed into the polycrystalline silicon film. When local fluctuations occur in laser output in the process of applying laser beams, the difference occurs in the crystallizability of the polycrystalline silicon film in the vertical direction of the panel 0, and this appears as the result of variations in the threshold voltage of the thin film transistor. Therefore, typically, the variations in the threshold voltage appear in the horizontal direction of the panel 0 along the lines of laser beams. In the example shown in the drawing, the threshold voltage Vth is higher in the part of the lines than that of the surroundings, whereas Vth is lower in the other lines than that of the surroundings. Since the fluctuations in Vth lead to fluctuations in the bootstrap gain, unevenness appears in the brightness in streaks along the lines. When Vth becomes smaller than the average, the loss in the bootstrap gain is small as well. Thus, streaks brighter than the surroundings occur. In contrast to this, when Vth becomes greater than the average, the loss in the bootstrap gain is great, causing streaks darker than the surroundings.

Figure 8:
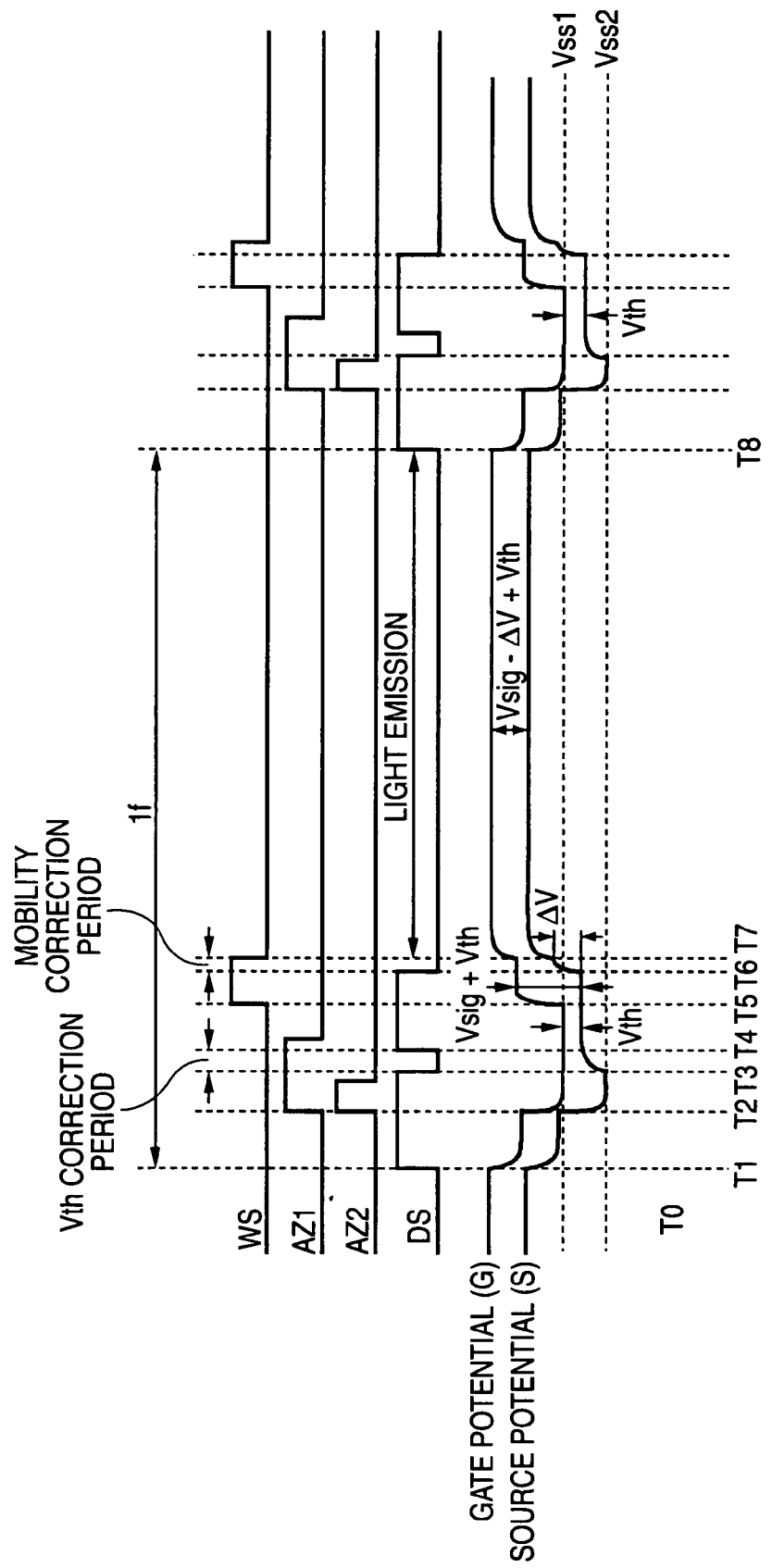
FIG. 8 shows another timing chart illustrative of the operation of the image display device shown in FIGS. 2 and 3.

FIG. 8 shows a timing chart depicting another exemplary drive method of the image display device shown in FIGS. 2 and 3. The notation similar to that of the timing chart shown in FIG. 4 is adopted for easier understandings. The difference from the drive method shown in FIG. 4 is in that in addition to the threshold voltage correcting operation and the bootstrap operation, the drive method performs the mobility correcting operation. Hereinafter, the drive method shown in FIG. 8 will be described in detail. At timing T0 before the field is started, all the control signals WS, AZ1, AZ2 and DS are at the low level. Therefore, the N-channel transistors Tr1, Tr2 and Tr3 are in the OFF state, whereas only the P-channel transistor Tr4 is in the ON state. Thus, since the drive transistor Trd is connected to the power source Vcc through the transistor Tr4 in the ON state, it supplies the output current Ids to the light emitting device EL in accordance with a predetermined input voltage Vgs. Therefore, the light emitting device EL emits light at timing T0. At this time, the input voltage Vgs to be applied to the drive transistor Trd is expressed by the difference between the gate potential (G) and the source potential (S).

At timing T1 at which the field is started, the control signal DS is switched from the low level to the high level. Thus, since the transistor Tr4 is turned off and the drive transistor Trd is separated from the power source Vcc, the light emission is stopped into the non emission period. Therefore, when it enters timing T1, all the transistors Tr1 to Tr4 are in the OFF state.

Subsequently, when the period goes to timing T2, the control signals AZ1 and AZ2 are at the high level, and then the switching transistors Tr2 and Tr3 are turned on. Consequently, the gate G of the drive transistor Trd is connected to the reference potential Vss1, and the source S is connected to the reference potential Vss2. Here, Vss1−Vss2>Vth is satisfied, and Vss1−Vss2=Vgs>Vth is made, and after that, Vth correction to be done at timing T3 is prepared. In other words, the period from T2 to T3 corresponds to the reset period of the drive transistor Trd. In addition, when the threshold voltage of the light emitting device EL is VthEL, it is set to VthEL>Vss2. Thus, a negative bias is applied to the light emitting device EL, and the state is a so-called reverse bias state. The reverse bias state is necessary to successfully perform the Vth correction operation and the mobility correcting operation.

At timing T3, the control signal AZ2 is turned to the low level, and right after this, the control signal DS is also turned to the low level. Thus, the transistor Tr3 is turned off, and the transistor Tr4 is turned on. Consequently, the drain current Ids is carried through the pixel capacitance Cs to start the Vth correction operation. At this time, the gate G of the drive transistor Trd is held at Vss1, and the current Ids is carried until the drive transistor Trd is cut off. When it is cut off, the source potential (S) of the drive transistor Trd is turned to Vss1−Vth. At timing T4 after the drain current is cut off, the control signal DS is again turned to the high level to cut off the switching transistor Tr4. Moreover, the control signal AZ1 is also returned to the low level, and the switching transistor Tr2 is also turned off. Consequently, Vth is held and fixed to the pixel capacitance Cs. As described above, the period from T3 to T4 is the period to detect the threshold voltage Vth of the drive transistor Trd. Here, the detecting period from T3 to T4 is called a Vth correction period.

As described above, after Vth correction is performed, the control signal WS is switched to the high level at timing T5, and the sampling transistor Tr1 is turned on to write the video signal Vsig to the pixel capacitance Cs. The pixel capacitance Cs is smaller enough than the equivalent capacitance Coled of the light emitting device EL. Consequently, most of the video signal Vsig is written to the pixel capacitance Cs. Precisely, Vsig−Vss1, the difference of Vsig from Vss 1, is written to the pixel capacitance Cs. Therefore, the voltage Vgs between the gate G and the source S of the drive transistor Trd is the level (Vsig−Vss1+Vth) that Vth detected and held before is added to Vsig−Vss1 sampled at this time. Hereinafter, for simplified description, when it is Vss1=0 V, the voltage Vgs between the gate and the source is Vsig+Vth as shown in the timing chart in FIG. 4. The sampling of the video signal Vsig is performed until timing T7 at which the control signal WS is returned to the low level. In other words, the period from T5 to T7 corresponds to the sampling period.

At timing T6 before timing T7 at which the sampling period is finished, the control signal DS is turned to the low level, and the switching transistor Tr4 is turned on. Thus, since the drive transistor Trd is connected to the power source Vcc, the pixel circuit goes from the non emission period to the light emission period. As described above, in the period from T6 to T7 in which the sampling transistor Tr1 is still in the ON state and the switching transistor Tr4 is in the ON state, the mobility of the drive transistor Trd is corrected. In other words, in this example, in the period from T6 to T7 in which the latter portion of the sampling period is overlapped with the beginning portion of the light emission period, the mobility is corrected. In addition, in the beginning of the light emission period in which the mobility is corrected, since the light emitting device EL is actually in the reverse bias state, it does not emit light. In the period from T6 to T7 to correct the mobility, the drain current Ids is carried through the drive transistor Trd in the state in which the gate G of the drive transistor Trd is fixed to the level of the video signal Vsig. Here, since Vss1−Vth<VthEL is set to allow the light emitting device EL in the reverse bias state, simple capacitance characteristics are shown, not the diode characteristics. Therefore, the current Ids carried through the drive transistor Trd is written to the capacitance C=Cs+Coled that combines the pixel capacitance Cs with the equivalent capacitance Coled of the light emitting device EL. Thus, the source potential (S) of the drive transistor Trd is rising. In the timing chart shown in FIG. 4, this rise is denoted by ΔV. Since the rise ΔV is eventually subtracted from the voltage Vgs between the gate and the source held in the pixel capacitance Cs, it means that negative feedback is applied. As described above, the negative feedback of the output current Ids of the drive transistor Trd is similarly applied to the input voltage Vgs of the drive transistor Trd, whereby the mobility μ can be corrected. In addition, the amount of negative feedback ΔV can be optimized by adjusting the time width t of the period from T6 to T7 to correct the mobility.

At timing T7, the control signal WS is turned to the low level, and the sampling transistor Tr1 is turned off. Consequently, the gate G of the drive transistor Trd is separated from the signal line SL. Since the application of the video signal Vsig is released, the gate potential (G) of the drive transistor Trd is allowed to rise, and it rises together with the source potential (S). During this period, the voltage Vgs between the gate and the source held in the pixel capacitance Cs maintains the value of (Vsig−ΔV+Vth). In association with the rise of the source potential (S), the reverse bias state of the light emitting device EL is cancelled, and then the output current Ids flows to actually start the light emission of the light emitting device EL. The relation between the drain current Ids and the gate voltage Vgs at this time is given as Equation (5) below by substituting Vsig−ΔV+Vth into Vgs of Equation (1) for the transistor characteristics above.

$$Ids = k\mu(Vgs-Vth)^2 = k\mu(Vsig-\Delta V)^2 \quad (5)$$

In Equation (5), k=(1/2)(W/L)Cox. It is revealed from Equation (5) for the characteristics that the term Vth is cancelled and the output current Ids supplied to the light emitting device EL does not depend on the threshold voltage Vth of the drive transistor Trd. Basically, the drain current Ids is determined by the signal voltage Vsig of the video signal. In other words, the light emitting device EL is to emit light in accordance with the brightness corresponding to the video signal Vsig. At this time, Vsig is corrected by the amount of feedback ΔV. The correcting amount ΔV works so as to cancel the effect of the mobility μ positioned at the coefficient part of Equation (5) for the characteristics. Therefore, the drain current Ids substantially depends only on the video signal Vsig.

Finally, at timing T8, the control signal DS is turned to the high level, the switching transistor Tr4 is turned off, and light emission is finished as well as the field is ended. After that, the process goes to the subsequent field, and the Vth correction operation, the mobility correcting operation and the light emission operation are again repeated.

Figure 9:
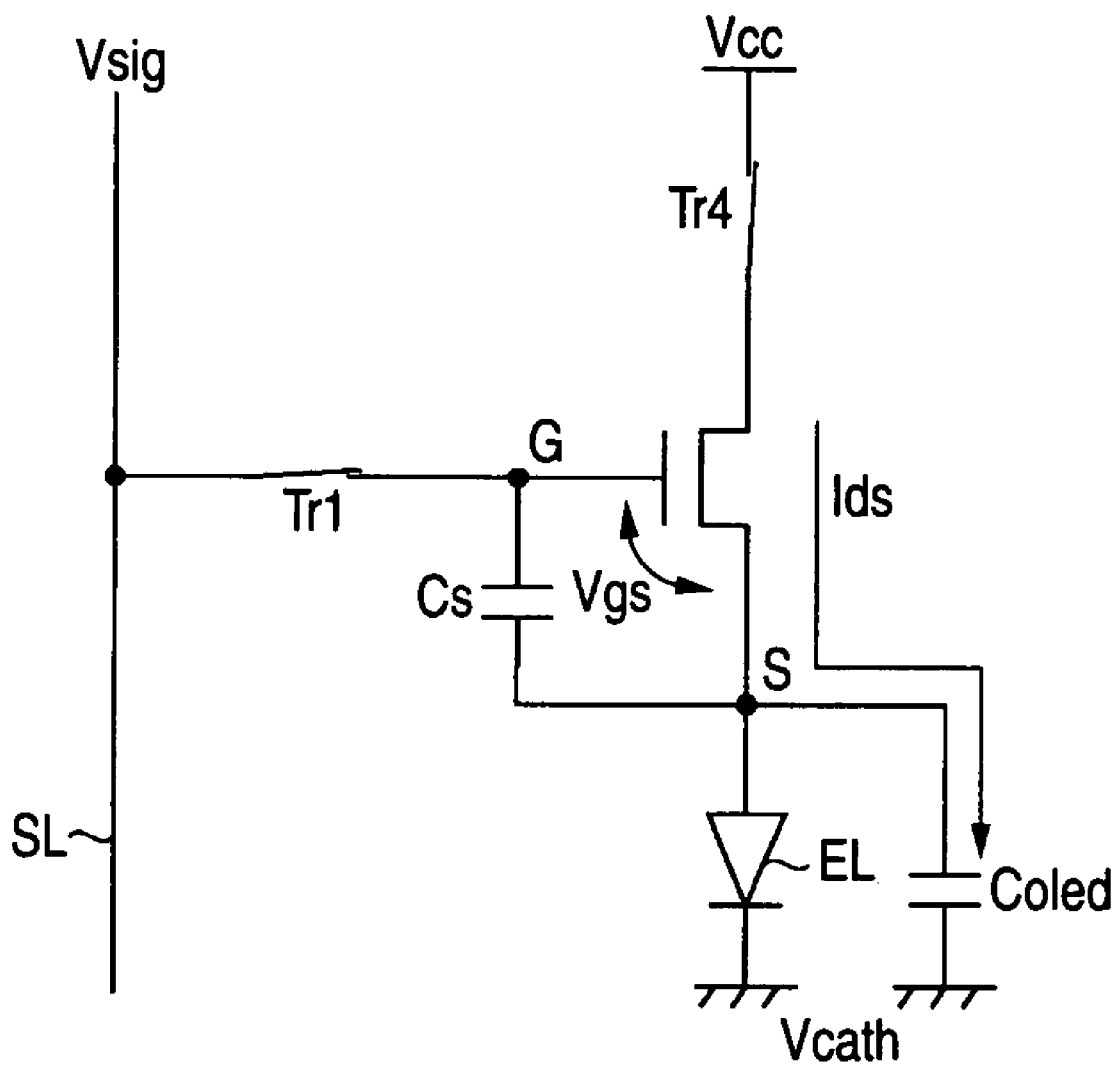
FIG. 9 shows a schematic diagram illustrative of the image display device according to an embodiment of the invention.

FIG. 9 shows a circuit diagram depicting the state of the pixel circuit 2 in the period from T6 to T7 to correct the mobility. As shown in the drawing, in the period from T6 to T7 to correct the mobility, the sampling transistor Tr1 and the switching transistor Tr4 are turned on, whereas the remaining switching transistors Tr2 and Tr3 are turned off. In this state, the source potential (S) of the drive transistor Tr4 is Vss1−Vth. The source potential (S) is also the anode potential of the light emitting device EL. As described above, Vss1−Vth<VthEL is set, and thus the light emitting device EL in the reverse bias state, and shows simple capacitance characteristics, not the diode characteristics. Therefore, the current Ids carried through the drive transistor Trd flows into the capacitance C=Cs+Coled that combines the pixel capacitance Cs with the equivalent capacitance Coled of the light emitting device EL. In other words, the negative feedback of a part of the drain current Ids is applied to the pixel capacitance Cs to correct the mobility.

Figure 10:
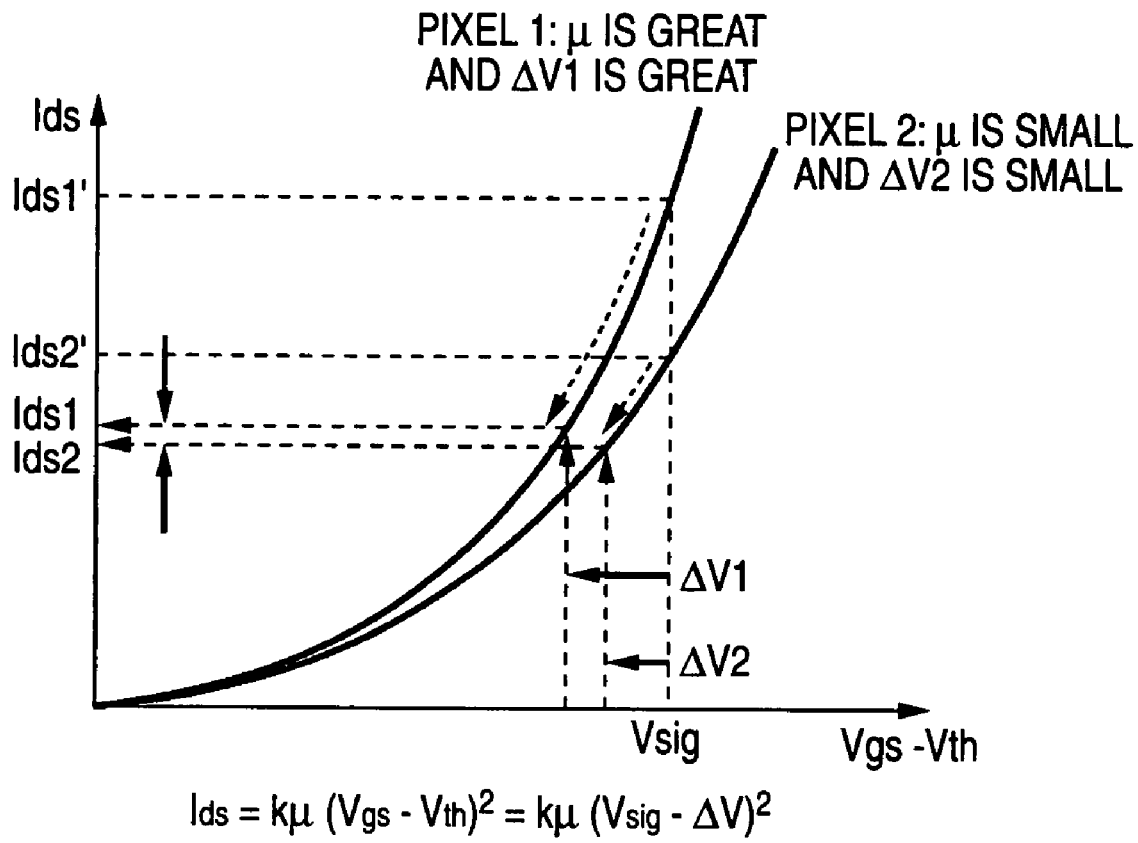
FIG. 10 shows a graph illustrative of the image display device according to an embodiment of the invention.
Figure 11:
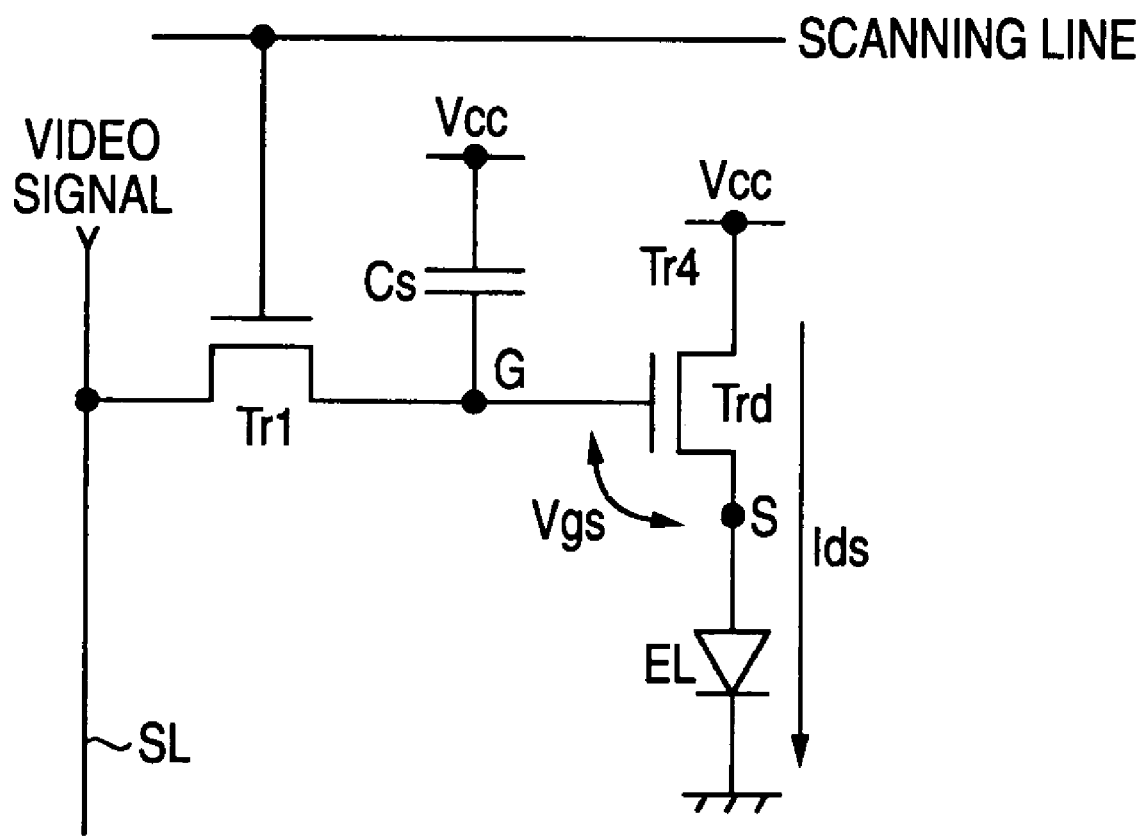
FIG. 11 shows a circuit diagram depicting an exemplary conventional pixel circuit.
Figure 12:
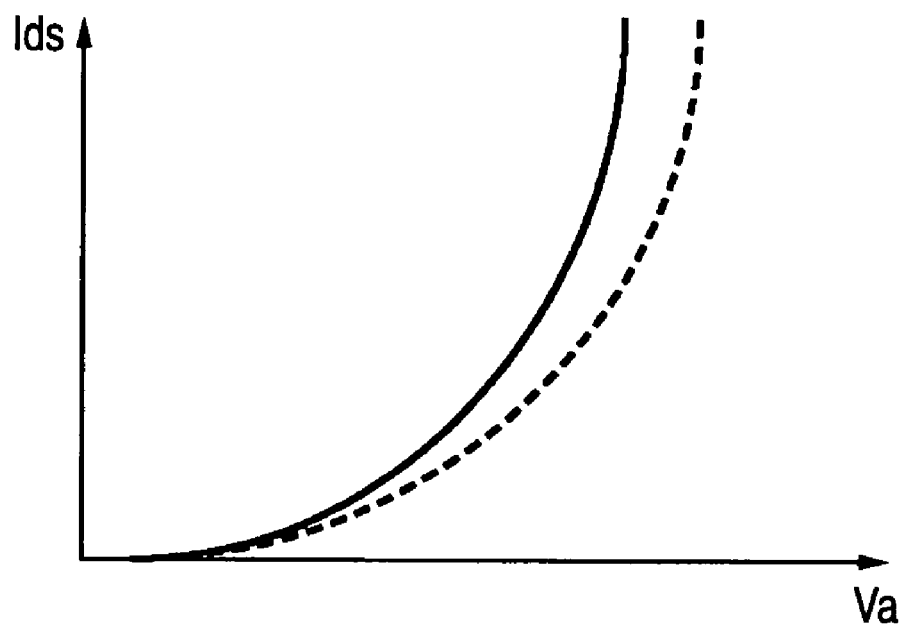
FIG. 12 shows a graph depicting the current-voltage characteristics of a light emitting device.

FIG. 10 shows a graph depicting Equation (5) for the transistor characteristics described above, in which the vertical axis indicates Ids, and the horizontal axis indicates Vsig. Below the graph, Equation (5) for the characteristics is also shown. The graph shown in FIG. 10 depicts the characteristic curve as the pixel 1 is compared with the pixel 2. The mobility μ of the drive transistor of the pixel 1 is relatively great. In contrast to this, the mobility μ of the drive transistor included in the pixel 2 is relatively small. As described above, when the drive transistor is configured of a polysilicon thin film transistor, it is inevitable to vary the mobility μ among the pixels. For example, in the case in which the signal potential Vsig of the video signal at the same level is written to the pixels 1 and 2, if the mobility is not corrected at all, a large difference occurs between the output current Ids1' carried through the pixel 1 with a greater mobility μ and the output current Ids2' carried through the pixel 2 with a smaller mobility μ. As described above, since a large difference occurs between the output currents Ids caused by the variations in mobility μ, unevenness like streaks occurs to impair the uniformity of the screen.

Then, in an embodiment of the invention, the negative feedback of the output current is applied to the input voltage side, whereby the variations in mobility are cancelled. As apparent from Equation (1) for the transistor characteristics, the greater mobility is, the larger the drain current Ids is. Therefore, the amount of negative feedback ΔV becomes larger as the mobility is greater. As shown in the graph in FIG. 10, the amount of negative feedback ΔV1 of the pixel 1 with a larger the mobility μ is greater than the amount of negative feedback ΔV2 of the pixel 2 with a smaller mobility. Therefore, a larger negative feedback is applied as the mobility μ is greater, and then variations can be suppressed. As shown in the drawing, when ΔV1 is corrected in the pixel 1 with a greater mobility μ, the output current greatly drops from Ids1' to Ids1. On the other hand, sine the correcting amount ΔV2 of the pixel 2 with a smaller mobility μ is small, the output current Ids2' does not so greatly drop to Ids2. Consequently, Ids1 is almost equal to Ids2, and the variations in mobility are cancelled. Since the cancellation of the variations in mobility is performed in the entire range of Vsig from the black level to the white level, the uniformity of the screen is significantly high. In summary, in the case in which there are the pixels 1 and 2 having different mobilities, the correcting amount ΔV1 of the pixel 1 with a greater mobility is smaller than the correcting amount ΔV2 of the pixel 2 with a smaller mobility. In other words, ΔV is larger as the mobility is greater, and the reduced value of Ids is larger. Therefore, the mobility of the current values of the pixels having different mobilities is made equal, and the variations in mobility can be corrected.

Hereinafter for reference, the numerical analysis of mobility correction described above will be described. As shown in FIG. 9, in the state in which the transistor Tr1 and Tr4 are turned on, a variable V is taken for the source potential of the drive transistor Trd for analysis. The drain current Ids carried through the drive transistor Trd is as expressed in Equation (6) below where the source potential (S) of the drive transistor Trd is V.

$$I_{ds}=K\mu(V_{gs}-V_{th})^2=K\mu(V_{sig}-V-V_{th})^2 \quad (6)$$

In addition, from the relation between the drain current Ids and the capacitance C (=Cs+Coled), Ids=dQ/dt=CdV/dt is held as shown in Equation (7) below.

$$\text{From } I_{ds} = \frac{dQ}{dt} = C\frac{dV}{dt}, \quad (7)$$

$$\int \frac{1}{C}dt = \int \frac{1}{I_{ds}}dV \Leftrightarrow \int_0^t \frac{1}{C}dt$$
$$= \int_{-V_{th}}^V \frac{1}{k\mu(V_{sig}-V_{th}-V)^2}dV \Leftrightarrow \frac{k\mu}{C}t$$
$$= \left[\frac{1}{V_{sig}-V_{th}-V}\right]_{-V_{th}}^V$$
$$= \frac{1}{V_{sig}-V_{th}-V} - \frac{1}{V_{sig}} \Leftrightarrow V_{sig}-V_{th}-V$$
$$= \frac{1}{\frac{1}{V_{sig}}+\frac{k\mu}{C}t}$$
$$= \frac{V_{sig}}{1+V_{sig}\frac{k\mu}{C}t}$$

Equation (6) is substituted into Equation (7), and both sides are integrated. Here, the initial state of the source voltage V is −Vth, and the correcting time (T6 to T7) for mobility variations is t. When this differential equation is solved, the pixel current with respect to the time t to correct mobility is given by Equation (8) below.

$$I_{ds} = k\mu\left(\frac{V_{sig}}{1+V_{sig}\frac{k\mu}{C}t}\right)^2 \quad (8)$$

Figure 13:
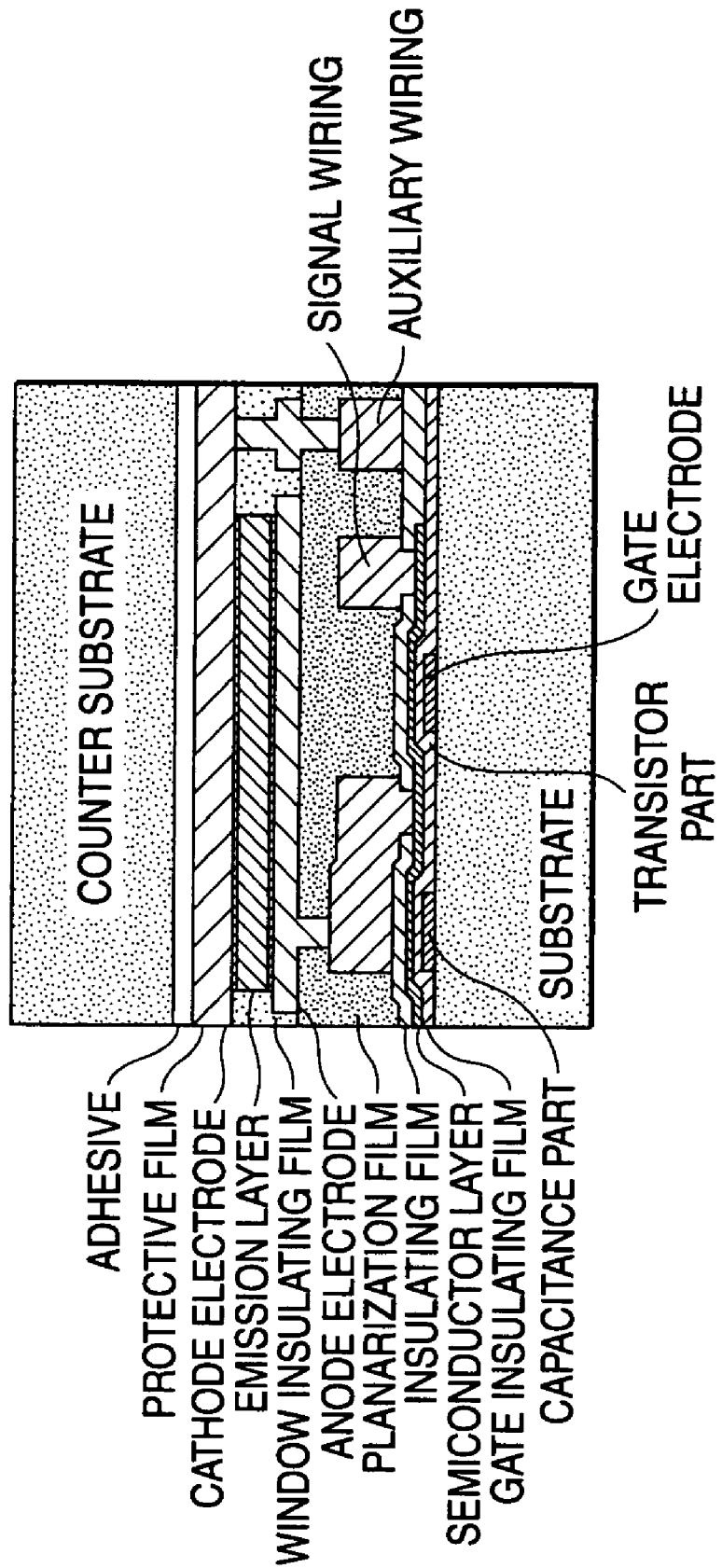
FIG. 13 shows a cross section depicting the device configuration of the display device according to an embodiment of the invention.

The display device according to an embodiment of the invention has the device configuration of thin films as shown in FIG. 13. This drawing schematically shows the cross sectional structure of a pixel formed on an insulating substrate. As shown in the drawing, the pixel includes a transistor part including a plurality of thin film transistors (a single TFT is shown in the drawing), a capacitance part such as holing capacitance, and a light emitting part such as an organic electroluminescent device. The transistor part and the capacitance part are formed on the substrate by TFT processes, and the light emitting part such as the organic electroluminescent device is laminated thereon. A transparent counter substrate is bonded thereon with an adhesive to form a flat panel.

Figure 14:
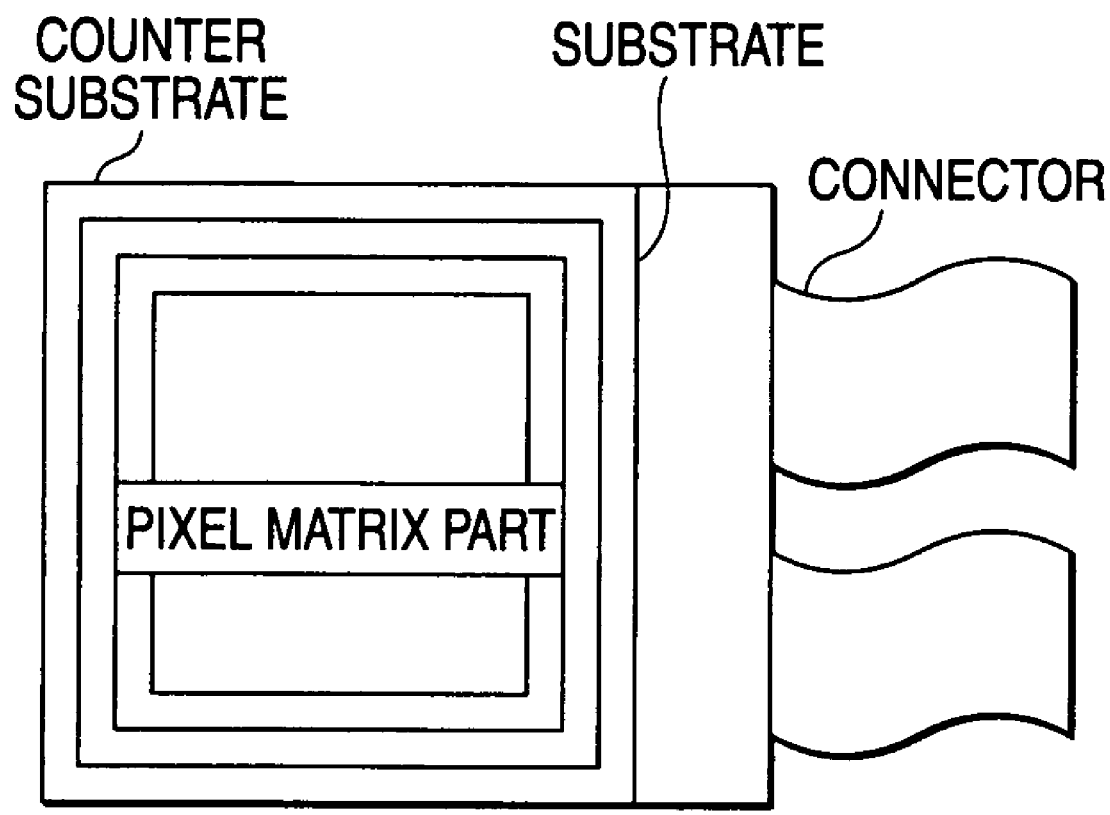
FIG. 14 shows the module configuration of a plan view depicting the display device according to an embodiment of the invention.

As shown in FIG. 14, the display device according to an embodiment of the invention may include a display device in a flat module shape. For example, on the insulating substrate, a pixel array part is arranged in which pixels formed of an organic electroluminescent device, thin film transistors, and a thin film capacitance are integrated and formed in a matrix. An adhesive is applied so as to surround the pixel array part (the pixel matrix part), and a counter substrate such as a glass substrate is bonded to form a display module. On the transparent counter substrate, a color filter, a protective film, and a light shielding film may be disposed as necessary. For example, on the display module, a FPC (flexible printed circuit) may be disposed as a connector to externally input and output signals to the pixel array part.

The display device described above according to an embodiment of the invention has a flat panel shape, and can be adapted to the displays of electronic appliances in various fields such as a digital camera, a notebook personal computer, a cellular telephone, and a video camera, in which video signals inputted to the electronic appliance or generated in the electronic appliance are displayed as an image or video. Hereinafter, an exemplary electronic appliance is shown to which such a display device is adapted.

Figure 15:
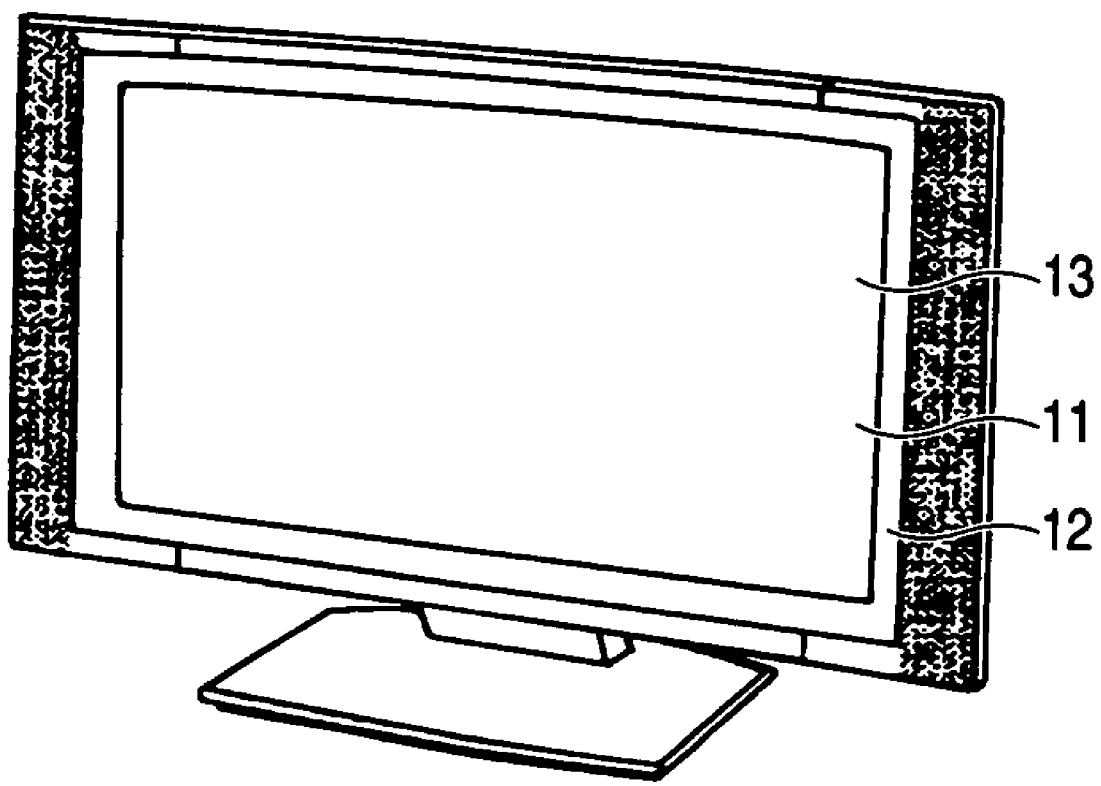
FIG. 15 shows a perspective view depicting a television set having the display device according to an embodiment of the invention.

FIG. 15 shows a television set to which an embodiment of the invention is adapted, including a video display screen 11 configured of a front panel 12, a filter glass 13 and so on, which is fabricated by using the display device according to an embodiment of the invention for the video display screen 11.

Figure 16:
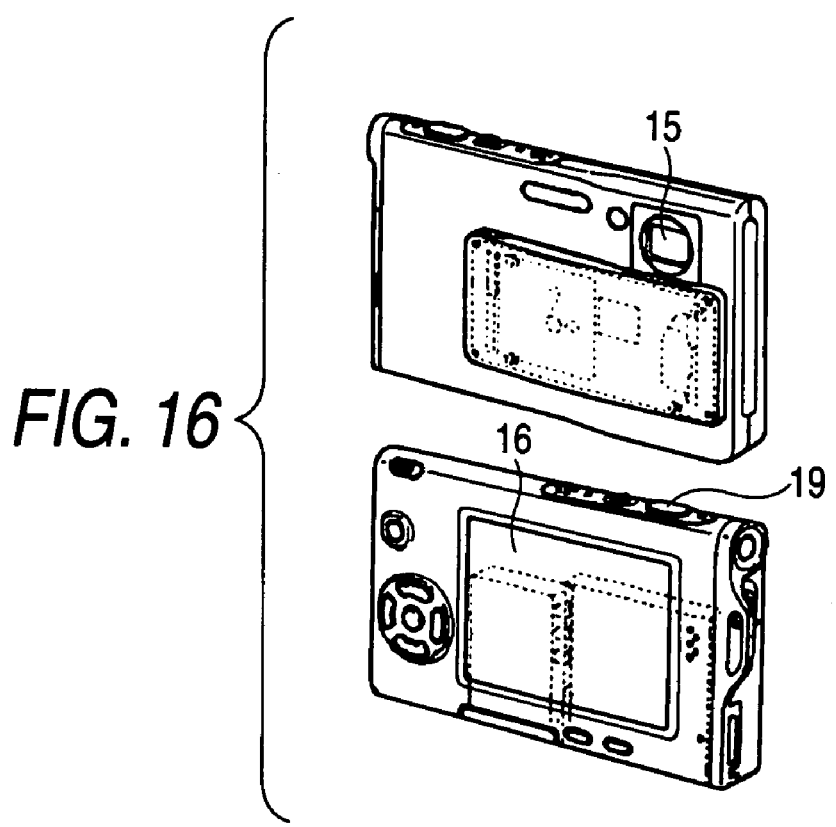
FIG. 16 shows a perspective view depicting a digital still camera having the display device according to an embodiment of the invention.

FIG. 16 shows a digital camera to which an embodiment of the invention is adapted, the upper is a front view and the lower is a rear view. This digital camera includes an imaging lens, a flash light emitting part 15, a display part 16, a control switch, a menu switch, a shutter 19, and so on, which is fabricated by using the display device according to an embodiment of the invention for the display part 16.

Figure 17:
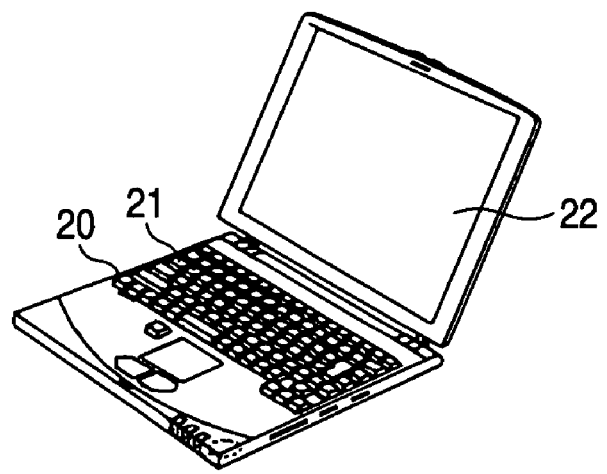
FIG. 17 shows a perspective view depicting a notebook personal computer having the display device according to an embodiment of the invention.

FIG. 17 shows a notebook personal computer to which an embodiment of the invention is adapted, including a keyboard 21 that is operated when letters are inputted to a main body 20, and a main cover includes a display part 22 that an image is displayed, which is fabricated by using the display device according to an embodiment of the invention for the display part 22.

Figure 18:
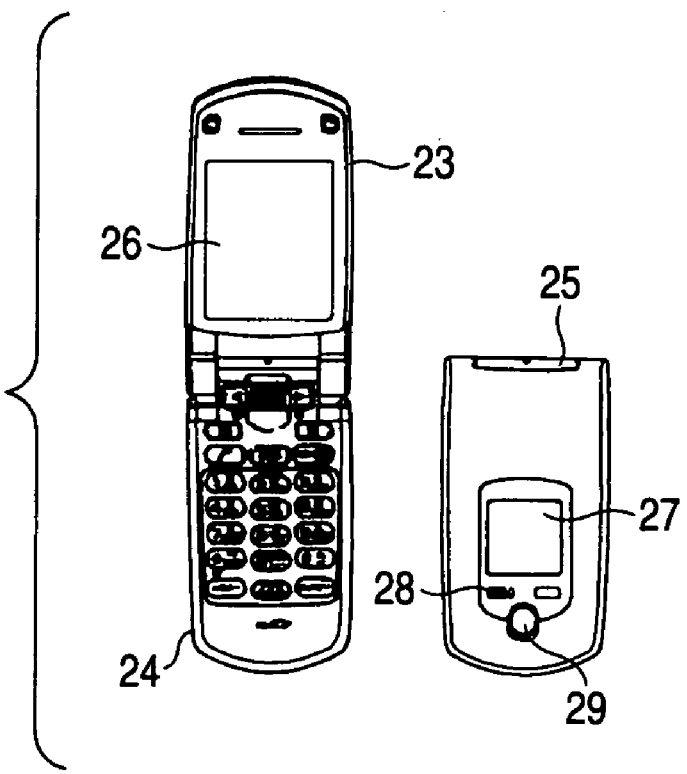
FIG. 18 shows a schematic diagram depicting a mobile terminal device having the display device according to an embodiment of the invention.

FIG. 18 shows a mobile terminal device to which an embodiment of the invention is adapted, the left shows it opening, and the right shows it closed. The mobile terminal device includes an upper housing 23, a lower housing 24, a joining part (here, a hinge part) 25, a display 26, a sub-display 27, a picture light 28, a camera 29 and so on, which is fabricated by using the display device according to an embodiment of the invention for the display 26 and the sub-display 27.

Figure 19:
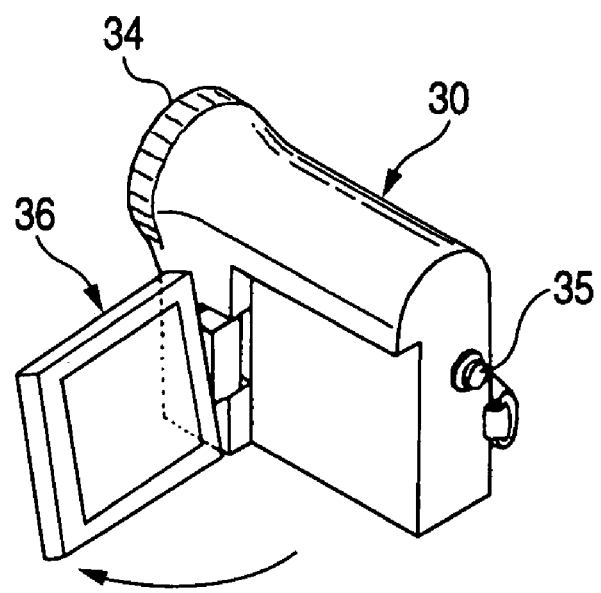
FIG. 19 shows a perspective view depicting a video camera having the display device according to an embodiment of the invention.

FIG. 19 shows a video camera to which an embodiment of the invention is adapted, including a main body 30, a lens 34 for shooting a subject on the side surface facing to the front, a start/stop switch 35 when shooting, a monitor 36, and so on, which is fabricated by using the display device according to an embodiment of the invention for the monitor 36.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
   a pixel array part;

a scanner part; and
a signal part,
wherein the pixel array part includes
- a first scanning line, a second scanning line, a third scanning line and a fourth scanning line arranged in rows, signal lines arranged in columns, pixel circuits in a matrix connected to the scanning lines and signal lines, and a plurality of power source lines which supplies first potential, second potential and third potential necessary for the operations of pixel circuit,
the signal part supplies a video signal to the signal lines,
the scanner part supplies a control signal to the first scanning line, the second scanning line, the third scanning line and the fourth scanning line, and in turn scans the pixel circuit for every row,
each of the pixel circuits includes a sampling transistor, a drive transistor, a first switching transistor, a second switching transistor, a third switching transistor, a pixel capacitance, and a light emitting device,
the sampling transistor conducts in response to the control signal supplied from the first scanning line in a predetermined sampling period, and samples the signal potential of the video signal supplied from the signal line to the pixel capacitance,
the pixel capacitance applies input voltage to a gate of the drive transistor in accordance with the signal potential of sampled video signal,
the drive transistor supplies output current in accordance with the input voltage to the light emitting device,
the light emitting device emits light at brightness in accordance with the signal potential of the video signal with the output current supplied from the drive transistor for a predetermined light emission period,
the first switching transistor conducts in response to the control signal supplied from the second scanning line prior to the sampling period, and sets the gate of the drive transistor to the first potential,
the second switching transistor conducts in response to control signal supplied from the third scanning line prior to the sampling period, and sets a source of the drive transistor to the second potential, and
the third switching transistor conducts in response to control signal supplied from the fourth scanning line prior to the sampling period, and connects the drive transistor to the third potential, whereby voltage corresponding to the threshold voltage of the drive transistor is held in the pixel capacitance to correct the influence of threshold voltage, and wherein the third switching transistor conducts in response to the control signal supplied from the fourth scanning line in the light emission period, and connects the drive transistor to the third potential to carry the output current through the light emitting device,
in which a channel length of the drive transistor is made longer than a channel length of the individual switching transistors to suppress fluctuations in threshold voltage, wherein in the pixel circuit, the channel length of the drive transistor is set so that during the light emission period, the source potential of the drive transistor is varied, whereas the input voltage applied to the gate of the drive transistor is not varied with reference to the source potential.

2. The image display device according to claim 1, wherein the scanner part is formed on a same substrate as the pixel array part is formed.

3. The image display device according to claim 1 or 2, wherein the channel length of the drive transistor is set to 10 µm or greater.

4. An image display device comprising:
a pixel array part;
a scanner part; and
a signal part,
wherein the pixel array part includes
- a first scanning line, a second scanning line, a third scanning line and a fourth scanning line arranged in rows, signal lines arranged in columns, pixel circuits in a matrix connected to the scanning lines and signal lines, and a plurality of power source lines which supplies first potential, second potential and third potential necessary for the operations of pixel circuit,
the signal part supplies a video signal to the signal lines,
the scanner part supplies a control signal to the first scanning line, the second scanning line, the third scanning line and the fourth scanning line, and in turn scans the pixel circuit for every row,
each of the pixel circuits includes a sampling transistor, a drive transistor, a first switching transistor, a second switching transistor, a third switching transistor, a pixel capacitance, and a light emitting device,
the sampling transistor conducts in response to the control signal supplied from the first scanning line in a predetermined sampling period, and samples the signal potential of the video signal supplied from the signal line to the pixel capacitance,
the pixel capacitance applies input voltage to a gate of the drive transistor in accordance with the signal potential of sampled video signal,
the drive transistor supplies output current in accordance with the input voltage to the light emitting device,
the light emitting device emits light at brightness in accordance with the signal potential of the video signal with the output current supplied from the drive transistor for a predetermined light emission period,
the first switching transistor conducts in response to the control signal supplied from the second scanning line prior to the sampling period, and sets the gate of the drive transistor to the first potential,
the second switching transistor conducts in response to control signal supplied from the third scanning line prior to the sampling period, and sets a source of the drive transistor to the second potential, and
the third switching transistor conducts in response to control signal supplied from the fourth scanning line prior to the sampling period, and connects the drive transistor to the third potential, whereby voltage corresponding to the threshold voltage of the drive transistor is held in the pixel capacitance to correct the influence of threshold voltage, and wherein the third switching transistor conducts in response to the control signal supplied from the fourth scanning line in the light emission period, and connects the drive transistor to the third potential to carry the output current through the light emitting device,
in which a channel length of the drive transistor is made longer than a channel length of the individual switching transistors to suppress fluctuations in threshold voltage;
wherein output current of the drive transistor has dependence on a carrier mobility in a channel region, and
the third switching transistor conducts during the sampling period and connects the drive transistor to the third potential, takes the output current out of the drive transistor while the signal potential is being sampled, and applies the negative feedback of the output current to the pixel capacitance to correct the input voltage, whereby the dependence of the output current on the carrier mobility is cancelled.

5. An electronic appliance having the display device according to claim 1.

6. An image display device comprising:

scanning lines arranged in rows;

signal lines arranged in columns; and pixel circuits in a matrix connected to the scanning lines and signal lines, wherein each of the pixel circuits includes a sampling transistor, a drive transistor, a pixel capacitance, and a light emitting device, the sampling transistor has a gate connecting to the scan line, a source connecting to the signal line, and a drain connecting to a gate of the drive transistor, the pixel capacitance connects between a source and the gate of the drive transistor, and a channel length of the drive transistor is made longer than a channel length of the individual switching transistors to suppress fluctuations in threshold voltage; wherein in the pixel circuit, the channel length of the drive transistor is set so that during the light emission period, the source potential of the drive transistor is varied, whereas the input voltage applied to the gate of the drive transistor is not varied with reference to the source potential.

* * * * *